(12) United States Patent  (10) Patent No.: US 7,429,822 B2
Morita et al.  (45) Date of Patent: Sep. 30, 2008

(54) ORGANIC ELECTROLUMINESCENCE DEVICE HAVING A CATHODE WITH A METAL LAYER THAT INCLUDES A FIRST METAL AND A LOW WORK FUNCTION METAL

(75) Inventors: Haruyuki Morita, Yamatokoriyama (JP); Takashi Ogura, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 11 days.

(21) Appl. No.: 10/944,947

(22) Filed: Sep. 21, 2004

(65) Prior Publication Data

US 2005/0088082 A1  Apr. 28, 2005

(30) Foreign Application Priority Data

Oct. 28, 2003 (JP) .............................. 2003-367646
Oct. 28, 2003 (JP) .............................. 2003-367647

(51) Int. Cl.
*H01J 1/62* (2006.01)
*H01J 63/04* (2006.01)

(52) U.S. Cl. ..................... 313/504; 313/506; 313/505; 313/483; 313/498; 428/690; 428/917

(58) Field of Classification Search .................. 313/504
See application file for complete search history.

(56) References Cited

U.S. PATENT DOCUMENTS

| | | | |
|---|---|---|---|
| 4,769,292 A | | 9/1988 | Tang et al. |
| 5,414,069 A | * | 5/1995 | Cumming et al. ............. 528/10 |
| 5,969,474 A | | 10/1999 | Arai |
| 6,140,763 A | * | 10/2000 | Hung et al. .................. 313/503 |
| 6,284,393 B1 | | 9/2001 | Hosokawa et al. |
| 6,339,290 B1 | | 1/2002 | Nakaya |
| 6,707,248 B1 | * | 3/2004 | Burroughes et al. .......... 313/504 |

(Continued)

FOREIGN PATENT DOCUMENTS

JP  10-046138 A  2/1998

(Continued)

OTHER PUBLICATIONS

Official Communication issued in corresponding Japanese Patent Application No. 2003-367647, mailed Sep. 12, 2006.

(Continued)

*Primary Examiner*—Sikha Roy
*Assistant Examiner*—Natalie K Walford
(74) *Attorney, Agent, or Firm*—Keating & Bennett, LLP

(57) ABSTRACT

An organic EL device includes an anode, a cathode having optical transparency, and an organic EL layer disposed between the anode and the cathode and including at least a fluorescent layer. The cathode has a metal layer including a first metal and a low work function metal, and a conductive oxide layer arranged in this order from the organic EL layer side, and the work function of the low work function metal is smaller than the work function of the first metal. The metal layer has a first surface on the organic EL layer side and a second surface on the conductive oxide layer side, and the concentration of the low work function metal at the first surface is greater than the concentration of the low work function metal at the second surface.

29 Claims, 8 Drawing Sheets

U.S. PATENT DOCUMENTS

| | | |
|---|---|---|
| 7,012,364 B2 | 3/2006 | Mori et al. |
| 2002/0158835 A1 | 10/2002 | Kobayashi et al. |

FOREIGN PATENT DOCUMENTS

| | | | |
|---|---|---|---|
| JP | 10-125469 A | 5/1998 | |
| JP | 10-125474 A | 5/1998 | |
| JP | 11-185955 A | 7/1999 | |
| JP | 2000-133447 A | 5/2000 | |
| JP | 2001-085163 | 3/2001 | |
| JP | 2001-202820 A | 7/2001 | |
| JP | 2001-243840 A | 9/2001 | |
| JP | 2002-252086 A | 9/2002 | |
| JP | 2002-299065 A | 10/2002 | |
| JP | 2002367780 A | * | 12/2002 |
| JP | 2004-127639 A | 4/2004 | |
| JP | 2005-032563 A | 2/2005 | |

OTHER PUBLICATIONS

Official Communication issued in corresponding Japanese Patent Application No. 2003-367646, mailed Sep. 12, 2006.

Shang-Li Chen et al.; "Current Programmed Pixel Structures for OLED" Asia Display/IDW'01; pp. 399-402.

* cited by examiner

ORGANIC ELECTROLUMINESCENCE DEVICE HAVING A CATHODE WITH A METAL LAYER THAT INCLUDES A FIRST METAL AND A LOW WORK FUNCTION METAL

BACKGROUND OF THE INVENTION

1. Field of the Invention

The present invention relates to an organic electroluminescence (EL) device.

2. Description of the Related Art

An organic EL device receives attention because it can be driven with low power and is capable of achieving high intensity light emission. Thus, research and development concerning the organic EL device is being actively conducted. Generally, the organic EL device has a structure in which a fluorescent layer formed of an organic material is sandwiched between a pair of electrodes, at least one of which has optical transparency. A hole injection layer, a hole transport layer, an electron injection layer, an electron transport layer and the like between a pair of electrodes are provided.

The organic EL device can be used in, for example, a display apparatus. Drive systems of the display apparatus include a simple matrix system and an active matrix system, but the display apparatus of the simple matrix system has a problem in that power consumption increases as a display panel is increased in size because the instantaneous luminance of each pixel should be enhanced as the duty ratio increases. Thus, if a larger display panel is needed, the active matrix system is mainly used.

The display apparatus of the active matrix system using the organic EL device has a substrate on which a plurality of thin film transistors (hereinafter abbreviated as "TFT") are formed, and an organic EL device formed on the substrate. The TFT is formed for each of the pixels arranged in a matrix form. By turning the TFT of each pixel ON/OFF with a control signal, the light emission state of the organic EL device can be controlled for each pixel and as a result, an image can be displayed. Display apparatuses having such a configuration have generally used a system (bottom emission system) in which light from the organic EL device is extracted from the side opposite to the side of the TFT substrate on which the TFT is formed.

The organic EL device is classified into a low-molecular type and a polymer type depending on the type of a light emission material forming a fluorescent layer. The low-molecular type organic EL device has a fluorescent layer made of low-molecular light emission material, and a polymer type organic EL device has a fluorescent layer made of polymer light emission material.

In both the low-molecular type and the polymer type organic EL devices of the bottom emission system, ITO (indium tin oxide) and IZO (indium zinc oxide) having relatively large work functions are used as anodes. As preferred cathodes, for example, an alloy single layer film of Mg (magnesium) and silver (Ag), a layered film of a halogenated alkali metal such as LiF and Al, and the like are used for the low-molecular type organic EL device and for example, a layered film of a low-work function metal such as Ca or Ba and a relatively stable protective metal layer of Al, Ag or the like is used for the polymer type organic EL device. In this way, the low-molecular type organic EL device and the polymer type organic EL device are different in the preferred cathode material used. This is because the LUMO level of the polymer light emission material is lower than the LUMO level of the low-molecular light emission material, and therefore, the polymer type organic EL device preferably uses a cathode material having a smaller work function for effective injection of electrons.

If an active matrix type full color display is fabricated using the organic EL device, a pattern of an RGB (red, green and blue) fluorescent layer should be formed using mask vapor deposition for the low-molecular type organic EL device. Accordingly, enhancement of fineness (e.g. 200 PPI, etc.) of the organic EL device is difficult, and it is difficult to form the organic EL device on a glass substrate having a large area (e.g., about 1 m square), resulting in a problem that efficient production steps using such a glass substrate cannot be used. The polymer type organic EL device can be fabricated by a wet process, and therefore requires no mask vapor deposition or the like. Further, an organic EL device having high fineness can be formed on a glass substrate having a large area by a method such as inkjet printing. Thus, it is possible that the polymer type EL device is more advantageous than the low-molecular type EL device in terms of productivity and production costs.

If the active matrix type display apparatus using the organic EL device is fabricated, use of the bottom emission system results in the following problems.

The TFT usually has a semiconductor layer made of amorphous silicon or the like, and an electrode made of metal, but the semiconductor layer and electrode do not have sufficient optical transparency. Accordingly, the bottom emission system in which light is extracted through the TFT substrate has a problem in that the ratio of the pixel area to the light emission area (aperture ratio) decreases. For the organic EL display apparatus, a current drive system is suitably used because variations in display performance for each pixel are reduced, and a change in panel display luminance due to degradation of the organic EL material can be reduced, but 4 transistors are required for each pixel if the current drive system is used. Accordingly, the aperture ratio further decreases compared with the use of a voltage drive system (requiring 2 transistors for each pixel) that is simpler but inferior in variations in display for each pixel, and the like (Shang-Li Chen et al. IDW '01, p. 399).

Thus, a display apparatus configuration using a system (top emission system) in which light from the organic EL device is extracted above the TFT and organic EL device formed on the substrate has been proposed. In the top emission system, the problem with the aperture ratio can be prevented. However, in this system, firstly, the cathode, which is the upper electrode, of the organic EL device should be transparent so as to have light emission. Secondly, the cathode should be made of a material having a small work function for efficiently injecting electrons into the fluorescent layer. Thirdly, as described in detail below, damage to the lower layer resulting from processes of fabrication of the cathode should be prevented where possible. The cathode usually has a layered structure of an electron injecting electrode made of a very thin metal film so that light can be transmitted, and a transparent conductive film formed on the electron injecting electrode. The transparent conductive film is provided for protecting the electron injecting electrode being a thin metal layer and reducing a wiring resistance. For formation of the transparent conductive film, a method of generating particles of relatively high energy, such as sputtering or ion plating, is usually used, and therefore the electron injecting electrode, fluorescent layer and the like provided in the lower layer may be damaged, resulting in degradation in device characteristics.

Various configurations have been proposed for this cathode in top emission system devices. Those conventional configurations are principally based on the concept that a cathode material and an electron injection material capable of realizing favorable characteristics in the bottom emission system are transferred and applied as directly as possible to the cathode of the top emission system, and the thickness of an electrode layer made of those materials is reduced so that light emission from the cathode of the top emission system is realized.

For example, Japanese Laid-Open Patent Publication No. 2001-85163 discloses that an alloy of Mg and Ag being one of the cathode materials in the organic EL device of the bottom emission system (Japanese Patent No. 2814435, etc.) is used for the upper electrode or cathode of the top emission system. The low-molecular type EL device in this document includes a metal layer (Mg—Ag layer) having a sufficiently small thickness (10 nm) and a transparent conductive layer (IZO layer) formed in this order on a low-molecular fluorescent layer. Furthermore, Japanese Laid-Open Patent Publication No. 10-162959 discloses a low-molecular type organic EL device of the top emission system including a cathode having a layered structure of an electron injection layer and an amorphous transparent conductive film.

However, the above-described documents both deal with the configuration of the cathode where the low-molecular type organic EL device is used. As described above, the polymer type organic EL device and the low-molecular type organic EL device have different electrode configurations and electrode materials providing satisfactory characteristics, and therefore it is necessary to consider the configuration of the cathode that is useful for the polymer type organic EL device independently.

Furthermore, the electrode configuration in the above document also has the following problem.

A conductive oxide layer containing indium tin oxide (ITO) or indium zinc oxide (IZO) as a main component is used as a transparent conductive film in terms of optical transparency and resistivity, but the satisfactory conductive oxide layer made of ITO or IZO is generally formed while introducing oxygen gas into a film forming apparatus. The cathode has a metal layer for injection of electrons into the organic EL device, and for the material of this metal layer, a metal having a small work function (hereinafter referred to as "low work function metal"), for example, an alkali earth metal such as magnesium (Mg), calcium (Ca) or Barium (Ba), an alkali metal, indium (In) or an alloy of any of these metals is often used for improving the electron injection efficiency. Accordingly, if a metal layer made of low work function metal is formed, and a conductive oxide layer is formed with this metal layer as a ground, the low work function metal is easily oxidized with oxygen gas introduced into the film forming apparatus, resulting in degradation in device characteristics. Furthermore, even if the conductive oxide layer is formed while introducing only Ar gas into the film forming apparatus without introduction of oxygen gas, device characteristics may be degraded because the low work function metal is oxidized by oxygen contained in the conductive oxide layer.

Thus, there is the problem of oxidation of the metal layer particularly when a conductive oxide layer of ITO or the like is formed on a metal layer made of low work function metal, but the problem of degradation in characteristics or reliability associated with oxidation of the metal layer arises as long as the metal layer contacts the conductive oxide layer, irrespective of the order of formation. This problem with oxidation of the metal layer is especially serious in the case of the polymer type organic EL device using a metal having a smaller work function.

SUMMARY OF THE INVENTION

In order to overcome the problems described above, preferred embodiments of the present invention improve the light emission efficiency of an organic EL device which includes a cathode having a metal layer and a conductive oxide layer.

An organic EL device according to a preferred embodiment of the present invention preferably includes an anode, a cathode having optical transparency, and an organic EL layer disposed between the anode and the cathode and including at least a fluorescent layer. The cathode preferably has a metal layer including a first metal and a low work function metal, and a conductive oxide layer arranged in this order from the organic EL layer side, and the work function of the low work function metal is smaller than the work function of the first metal. The metal layer has a first surface on the organic EL layer side and a second surface on the conductive oxide layer side, and the concentration of the low work function metal at the first surface is preferably greater than the concentration of the low work function metal at the second surface.

In one preferred embodiment of the present invention, the concentration of the low work function metal at the second surface is preferably about 30% by mass or less.

In another preferred embodiment, the concentration of the low work function metal at the first surface is preferably about 5% by mass to about 50% by mass.

In still another preferred embodiment, the thickness of the first metal layer may be about 0.5 nm to about 20 nm.

In yet another preferred embodiment, the first metal preferably includes at least one type of metal selected from the group consisting of Ni, Os, Pt, Pd, Al, Au and Rh.

In this particular preferred embodiment, the low work function metal preferably includes at least one type of metal selected from the group consisting of Ca, Ba, Li and Cs.

In this particular preferred embodiment, the metal layer preferably includes a first metal layer having the first metal and the low work function metal, and a second metal layer including a second metal that is identical to or different from the first metal, arranged in this order from the organic EL layer side, wherein the second metal layer contains substantially no low work function metal, or contains the low work function metal in a concentration lower than the concentration of the low work function metal in the first metal layer.

In yet another preferred embodiment, the concentration of the low work function metal at the surface of the second metal layer on the conductive oxide layer side can be substantially zero.

In yet another preferred embodiment, the first metal layer has a third surface on the organic EL layer side and a fourth surface on the second metal layer side, and the concentration of the low work function metal at the first layer may be high in the third surface, and decrease as the fourth surface is approached.

In yet another preferred embodiment, the concentration of the low work function metal at the third surface of the first metal layer is preferably about 5% by mass to about 70% by mass.

In yet another preferred embodiment, the sum of the thickness of the first metal layer and the thickness of the second metal layer is preferably about 35 nm or less.

In yet another preferred embodiment, the thickness of the first metal layer may be about 0.5 nm to about 10 nm.

In yet another preferred embodiment, the second metal preferably includes at least one type of metal selected from the group consisting of Ni, Os, Pt, Pd, Al, Au and Rh.

In this particular preferred embodiment, the organic EL device is preferably a polymer type organic EL device and a top emission type device.

In yet another preferred embodiment, the fluorescent layer may include a polymer light emission material.

In yet another preferred embodiment, the conductive oxide layer is preferably formed by sputtering using a sputtering gas containing oxygen.

A display apparatus according to a preferred embodiment of the present invention includes an organic EL device and a thin film transistor electrically connected to the organic EL device. The organic EL device preferably includes an anode, a cathode having optical transparency, and an organic EL layer disposed between the anode and the cathode and including at least a fluorescent layer. The cathode preferably has a metal layer including a first metal and a low work function metal, and a conductive oxide layer arranged in this order from the organic EL layer side, and the work function of the low work function metal is smaller than the work function of the first metal. The metal layer has a first surface on the organic EL layer side and a second surface on the conductive oxide layer side, and the concentration of the low work function metal at the first surface is preferably greater than the concentration of the low work function metal at the second surface.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

A layered structure of Ca or Ba and Ag or Al is often used for an upper electrode (i.e., cathode) in a polymer type organic EL device of a bottom emission system. Alternatively, a structure having LiF and Ca stacked and Ag or Al further stacked thereon may preferably be used. If the conventional concept that "use of a suitable configuration of the upper electrode in the bottom emission system is transferred and applied to a top emission system" is followed, the following structures can be considered as suitable structures of the upper electrode of the top emission type polymer type organic EL device. One of the examples of these structures is a structure in which instead of Ag or Al, ITO or IZO is stacked on Ca or Ba. Furthermore, another example is a structure in which ITO or IZO is formed on the layered structure of Ca or Ba and Ag and Al. The inventors formed various electrodes of these examples of structures while changing conditions for fabrication of each layer, but could not obtain a polymer type organic EL device having a top emission structure that has excellent light emission efficiency.

Thus, the inventors conducted studies of various electrode materials and configurations from a variety of angles in a break with the conventional technical common sense that "use of a suitable configuration of the upper electrode in the bottom emission system is transferred and applied to the top emission system as directly as possible" as mentioned above. As a result, inventors found a very useful cathode configuration capable of being applied to the polymer type EL device, and preferably for use with a polymer type EL device having a top emission structure.

Preferred Embodiment 1

The first preferred embodiment of an organic EL device according to the present invention will be described with reference to the drawings.

Figure 1:
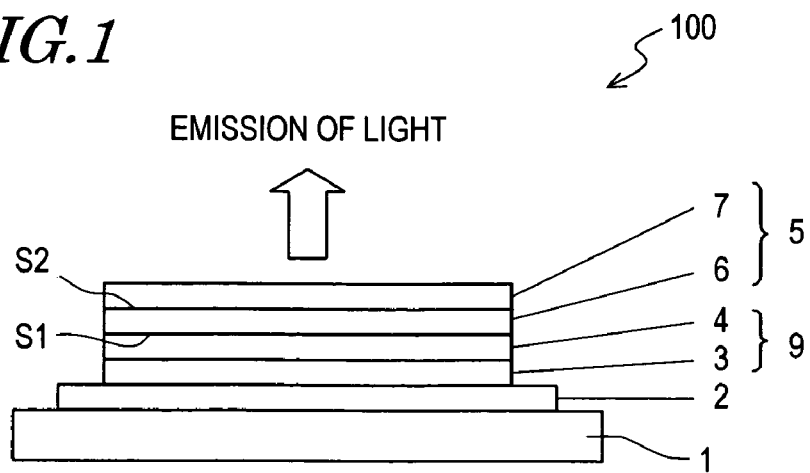
FIG. 1 is a sectional view schematically showing the configuration of an organic EL device of Preferred Embodiment 1 according to the present invention.

An organic EL device 100 shown in FIG. 1 has an anode 2, an organic EL layer 9 and a cathode 5 sequentially formed on a substrate 1. The organic EL layer 9 should have at least a fluorescent layer 4, and may be a single layer or may have a layered structure. Furthermore, in this preferred embodiment, the organic EL layer 9 has a hole injection layer 3 and a fluorescent layer 4 arranged in this order from the substrate 1 side. In the organic EL device 100 of this preferred embodiment, light from the fluorescent layer 4 is extracted from above the cathode 5 (top emission type), and therefore, the cathode 5 has optical transparency. The cathode 5 has a structure in which a metal layer 6 and a conductive oxide layer 7 including an oxide are stacked on the organic EL layer 9 in this order. The metal layer 6 includes a first metal, and a low work function metal having a work function that is smaller than that of the first metal. The concentration of the low work function metal at a surface S1 of the metal layer 6 on the side of the organic EL layer 9 is higher than the concentration of the low work function metal at a surface S2 of the metal layer 6 on the side of conductive oxide layer 7. Furthermore, the Ca concentration of the surface S2 in the metal layer 6 on the side of conductive oxide layer 7 may be substantially zero.

In the organic EL device 100, the cathode 5 is formed using the metal layer 6 including a low work function metal, and therefore the work function of the cathode 5 can be sufficiently decreased, thus making it possible to efficiently inject electrons into the organic EL layer 9. Furthermore, the metal layer 6 is not composed of the low work function metal alone, but preferably includes the first metal in addition to the low work function metal, and the concentration of the low work function metal is reduced to a low level on the surface S2 of the metal layer 6, whereby oxidation of the low work function metal during formation of the conductive oxide layer 7 can be effectively prevented. Thus, reduction in light emission efficiency of the organic EL device resulting from oxidation of the low work function metal can be prevented. In this specification, the "light emission efficiency" refers to a luminance (light flux) of extracted light with respect to power inputted to the organic EL device.

If reduction in light emission efficiency can be prevented, power inputted to the organic EL device for realizing a required luminance can be decreased. Thus, a current or voltage applied to the organic EL device can be reduced, degradation of the organic EL device can be therefore prevented and as a result, reliability of the organic EL device can be improved. Furthermore, after the organic EL device is formed, the low work function metal included in the metal layer 6 has a reduced amount near the conductive oxide layer 7, and is thus difficult to be oxidized by oxygen contained in the conductive oxide layer 7. Accordingly, degradation of the organic EL device due to an increase in resistance of the metal layer 6 and reduction in electron injection efficiency can be reliably prevented, thus making it possible to improve the reliability of the organic EL device.

The concentration of the low work function metal at the surface S1 of the metal layer 6 is preferably about 5% by mass or greater for ensuring a sufficient electron injection efficiency. It is preferable that the concentration of the low function metal at the surface S1 of the metal layer 6 is about 50% by mass or less because oxidation of the low work function metal can be prevented more reliably.

The concentration of the low work function metal at the surface S2 of the metal layer 6 is preferably about 30% by mass or less. This allows oxidation of the low work function metal to be prevented more reliably. The concentration of the low function metal at the surface S2 may be substantially zero.

In this way, by making the low work function metal exist in a higher concentration in an area in the metal layer 6 closer to the organic EL layer 9, oxidation of an electrode metal that is very active and susceptible to oxidation, such as Ca or Ba, which is suitably used particularly for the fluorescent layer 4 having a polymer light emission material, can be effectively prevented. Thus, an organic EL device, particularly a polymer organic EL device having a top emission structure, can be provided.

The thickness of the metal layer 6 is preferably about 0.5 nm or greater for the metal layer 6 to have a sufficient electron injection efficiency. Furthermore, the thickness of the metal layer 6 is preferably about 20 nm or less. If the thickness of the metal layer 6 is about 20 nm or less, the ratio of absorption of light from the organic EL layer by the metal layer 6 can be sufficiently reduced, thus making it possible to realize a transparent organic EL panel and an organic EL panel having a top emission structure.

The first metal in this preferred embodiment can be used as a host metal of the metal layer 6. The first layer included in the metal layer 6 preferably includes at least one type of metal selected from the group consisting of Ni, Os, Pt, Pd, Al, Au and Rh, and films formed from these metals are difficult to have island structures even with the reduced thickness, excellent in coverage characteristics, and excellent in preventing oxidation of the low work function metal, thus making it possible to realize a high efficiency organic EL device. Furthermore, in this specification, films "having no island structures" generally include continuous films and may be, for example, films having pinholes and the like, and porous films.

The low work function metal included in the metal layer 6 preferably includes at least one type of metal selected from the group consisting of Ca, Ba, Li and Cs. The work function of these metals is preferably as small as about 4.0 eV, and therefore, if the metal layer 6 including these metals is formed, electrons can be efficiently injected into an organic EL layer using a polymer light emission material in particular.

The cathode 5 should preferably include at least one metal layer 6 and one conductive oxide layer 7, and each layer may have a layered structure. Furthermore, the cathode 5 may further include other layers which are different in functions from these layers. However, it is desirable that the metal layer 6 should contact the organic EL layer 9 for efficiently injecting electrons into the organic EL layer.

In the organic EL device 100, the conductive oxide layer 7 is formed with the surface S2 of the metal layer 6 as a ground, but a protecting cap layer preventing oxidation of the metal layer 6 may be provided between the metal layer 6 and the conductive oxide layer 7. Preferably, the protecting cap layer is not provided, but the conductive oxide layer 7 is provided in contact with the surface S2 of the metal layer 6. In this preferred embodiment, the low work function metal forms an alloy with a metal (Al) being a base material, and the concentration of the low work function metal (Ca) at the surface S2 of the first metal layer is controlled to be low, thus making it possible to sufficiently prevent oxidation of the low work function metal even if the cap layer is not provided, i.e., the low work function metal is exposed at the surface S2. Furthermore, if the cap layer is not provided, the problems of the brightness of extracted light decreasing due to absorption of light in the cap layer, and the additional step of forming the cap layer, which complicates the production process and increases production costs, can be prevented.

By forming the organic EL device of this preferred embodiment on an active matrix substrate, a display apparatus of the active matrix system that is excellent in display characteristics can be formed.

The organic EL layer 9 may include an organic layer formed from a solution using a polymer material. Consequently, a thin film formation method not using a vacuum, such as the printing method or inkjet method, may be used, thus making it possible to fabricate the organic EL device at a lower cost.

The fluorescent layer 4 in the organic EL layer 9 may have a single layer structure, or may have a multilayer structure. Furthermore, the fluorescent layer 4 may be a layer having a base material doped with a dopant.

The organic EL layer 9 in this preferred embodiment has the hole injection layer 3 and the fluorescent layer 4 arranged in this order from the anode 2 side, but the configuration of the organic EL layer 9 is not limited to the configuration shown in FIG. 1. For example, the organic EL layer 9 may have any of the following configurations:

(1) organic fluorescent layer;
(2) hole transport layer/organic fluorescent layer;
(3) organic fluorescent layer/electron transport layer;
(4) hole transport layer/organic fluorescent layer/electron transport layer; and
(5) hole injection layer/hole transport layer/organic fluorescent layer/electron transport layer.

The fluorescent layer 4 included in the organic EL layer 9 may be a single layer or may have a multi-layered structure.

The light emission material included in the fluorescent layer 4 may be a polymer material or may be a low-molecular material, and well known light emission materials for organic EL devices may be used. Well known light emission materials may be classified into low-molecular light emission materials, polymer light emission materials, precursors of polymer light emission materials, and the like. Specific compounds of the respective light emission materials will be illustrated, but the present invention is not limited to these compounds.

For the low-molecular light emission material, aromatic dimethyldiene compounds such as 4,4'-bis(2,2'-diphenylvinyl)-phenyl (DPVBi), oxadiazole compounds such as 5-methyl-2-[2-[4-(5-methyl-2-benzooxadilyl)phenyl]vinyl]benzooxazole, triazole compounds such as 3-(4-biphenilyl)-4-phenyl-5-t-butylphenyl-1,2,4-triazole (TZA), styrylbenzene compounds such as 1,4-bis (2-methystyryl)benzene, fluorescent organic materials such as thiopyrazine dioxide derivatives, benzoquinone derivatives, naphthoquinone derivatives and anthraquinone derivatives, fluorescent organic compounds such as azomethine zinc complexes and (8-hydroxynolinate) aluminum complexes, and the like may be used.

For the polymer light emission material, poly(2-decyloxy-1,4-phenylene)(DO-PPP), poly[2,5-bis-[2-(N,N,N-triethylammonium)ethoxy]-1,4-phenyl-art-1,4-phenyllene]dibromide (PPP-Net$^{3+}$), poly[2-(2'ethylhexyloxy)-5-methoxy-1,4-phenylenevinylene] (MEH-PPV), and the like may be used.

Furthermore, as the precursor of the polymer light emission material, poly(P-phenylenevinylene) precursors (Pre-PPV), poly(P-naphthalenevimylene) precursors (Pre-PNV), and the like may be used.

The fluorescent layer 4 may be formed by a well known method. For example, by depositing an organic light emission material using a dry process such as the direct vacuum vapor deposition method, EB method or MBE method, the fluorescent layer may be formed. Alternatively, the fluorescent layer may be formed by adding an organic fluorescent layer forming solution including an organic light emission material using a wet process such as the spin coating method, doctor blade method, discharge coating method, spray coating method, inkjet method, relief printing method, intaglio printing method, screen printing method and microgravure method.

In the case where the wet process is used, the organic fluorescent layer forming solution should only include at least one type of light emission material, and may include two or more types of light emission materials. Furthermore, it may include a leveling agent, a light emission assist agent, additives (donor, acceptor, etc.), a charge transporting agent, a luminous dopant and the like in addition to the light emission material. Furthermore, the solvent of the organic fluorescent layer forming solution may be any solvent capable of dissolving or dispersing the light emission material, and may be, for example, pure water, methanol, ethanol, THF (tetrahydrofuran), chloroform, toluene, xylene, trimethyl benzene or the like.

The hole transport layer and the electron transport layer (collectively referred to as "charge transport layer") may each have a single layer structure, or a multilayered structure. The charge transport layer may be formed by a well known method (dry process, wet process) as described as the method for forming the fluorescent layer, for example. If the charge transport layer is formed by the wet process, the solvent of a charge transport layer forming solution is any solvent capable of dissolving or dispersing a charge transport material, and may be a solvent illustrated above as the solvent of the fluorescent layer forming solution.

As the charge transport material included in the charge transport layer, a well known material may be used. Specific compounds of such materials will be described below, but the present invention is not limited to these compounds.

As the hole transport material included in the hole transport layer, for example, low-molecular materials such as polyphylline compounds, aromatic tertiary amine compounds such as N,N'-bis-(3-methylphenyl)-N,N'-bis-(phenyl)-benzidine (TPD) and N,N'-di(naphthalene-1-il)-N,N'-diphenylbenzidine (NPD), hydrazone compounds, quinacridone compounds and stilamine compounds, polymer materials such as polyaniline, 3,4-polyethylenedioxythiophene/polystyrene-sulfonate (PEDT/PSS), poly(triphenylamine derivatives), polyvinyl carbazole (PVCz), and polymer material precursors such as poly(P-phenylenevinylene) precursors and poly(P-naphthalenevinylene) precursors may be used.

As the electron transport material included in the electron transport layer, for example, low-molecular materials such as oxadiazole derivatives, triazole derivatives, benzoquinone derivatives, naphthoquinone derivatives and fluorenone derivatives, and polymer materials such as poly[oxadiazole] may be used.

The anodes 2 and cathodes 5 may be formed from the electrode materials illustrated below.

The anode may be, for example, a layer composed of an electrode material such as a metal material having a large work function, such as Au, Ni and Pt, or a conductive metal oxide such as ITO, IZO and $SnO_2$. Furthermore, it may have a multilayered structure including layers composed of the above-described electrode material. For example, the anode 2 may have a structure in which, on the layer composed of the above-described electrode material on the organic EL layer 9 side is provided an $SiO_2$ layer having a thickness that is not so large that the conductivity of the former layer is significantly hindered (e.g., about 1 nm). The surface of the $SiO_2$ layer is excellent in compatibility (wettability) with the organic fluorescent layer forming solution and the charge transport layer forming solution and therefore by adding the $SiO_2$ layer, adhesion between the anode 2 and the organic EL layer 9 can be improved.

As the low work function metal included in the metal layer 6 of the cathode 5, Ca, Ce, Yb, Cs, Rb, Sr, Ba, Al or an alloy of Mg and Ag, an alloy of Al and Li, or the like may be used. If among them, Ca, Ce, Cs, Rb, Sr, Ba, Mg or Li having a work function of about 4.0 eV or less is used, a high electron injection efficiency can be obtained. If the fluorescent layer 4 of the polymer light emission material is formed, Ca and Ba are suitably used as the low work function metal. By doping a host metal (first metal) with the low work function metal, the metal layer 6 can be formed. The metal layer 6 is preferably formed using a chemically relatively stable metal, e.g. Ni, Os, Pt, Pd, Al, Au or Rh as the first metal. Consequently, not only oxidation of the low work function metal included in the metal layer 6 is prevented, but also the metal layer 6 itself is not oxidized, thus making it possible to prevent degradation of the cathode 5. Furthermore, the metal layer 6 preferably has a transmittance of about 10% or greater over the entire visible light region. For example, a Ni film (thickness of about 35 nm) formed on a synthetic quartz substrate by the electron beam vapor deposition method was shown to be excellent in coverage characteristics because it had a transmittance of about 10% over the entire visible light region, and had no island form in observation of the surface morphology by a scanning electron microscope. Films composed of other materials described above were shown to have more or less satisfactory transmittances and coverage characteristics. Furthermore, for forming a film having no island structure, a metal material that is hard to cause an island structure is preferably selected as the host metal depending on the formation method and thickness. It was ensured in the above experiment that use of, for example, Ni, Al or the like as the host metal could form a film having no island structure even if it had a small thickness. Furthermore, materials (Os, Pd, etc.) for use in thin film coating are generally difficult to cause an island structure, and therefore can be used as the host metal of the metal layer 6.

The organic EL device 100 of FIG. 1 is preferably a top emission type but by using a transparent substrate such as a glass substrate as the substrate 1, light from the fluorescent layer 4 can be extracted from below the substrate 1 (bottom emission). In this case, by performing control so that the concentration of the low work function metal is high on the surface on the organic EL layer side, and low on the surface on the conductive oxide layer side, oxidation of the metal layer 6 can be prevented, thus making it possible to obtain an effect similar to that described above.

The configuration of the organic EL device of preferred embodiments of the present invention is especially advantageous if applied to the polymer type organic EL device. This is because for injecting electrons into the fluorescent layer 4 including a polymer light emission material, a metal having a lower work function is required as described previously, and oxidation of such a metal can be prevented.

Application of preferred embodiments of the present invention to the polymer type organic EL device having a PEDOT/PSS layer as a hole injection layer is further advantageous. The reason for this will be described in detail below.

In the polymer type organic EL device, PEDOT/PSS is suitably used as a material of the hole injection layer. As well known, however, the conventional organic EL device has a problem in that diffusion of sulfur (S) contained in PEDOT/PSS causes a reduction in life characteristics. A very small amount of water ($H_2O$) remains in the PEDOT/PSS layer. A sulfurous acid removal reaction between $H_2O$ and PSS generates a sulfur compound, and the sulfur compound is diffused in the fluorescent layer. The diffused sulfur compound undergoes an oxidation-reduction reaction with the cathode (low work function metal) at the interface between the organic EL layer and the cathode. This oxidation reduction reaction is further promoted by application of a voltage to the organic EL device. As a result of the oxidation reduction reaction, a new metal sulfur compound is formed at the interface between the organic EL layer and the cathode, and this new metal sulfur compound causes a reduction in life characteristics of the organic EL device. Particularly, Ca and Ba that are suitably used as the cathode material of the polymer type organic EL device are highly reactive with S, and form sulfides (CaS, BaS), respectively, which reduce life characteristics. On the other hand, according to preferred embodiments of the present invention, the low work function metal included in the cathode (e.g. Ca) forms an alloy layer with other metal. In this way, since it can be considered that the low work function metal included in the alloy is difficult to react with S (difficult to be sulfurized), generation of the metal sulfur compound at the interface between the cathode and the organic EL layer can be prevented and as a result, life characteristics can be improved.

EXAMPLE 1

An organic EL device of Example 1 (FIG. 1) is preferably fabricated by the following method.

A striped Pt electrode (width: about 2 mm, length: about 5 cm, thickness: about 150 nm) 2 is formed as an anode 2 on an insulative substrate 1 that is preferably about five cm square. Then, on the anode 2, a mixed aqueous solution of polyethylene dioxythiophene (PEDOT) and polystyrenesulfonic acid (PSS) is added by the spin coating method, and dried at about 150° C. for approximately 20 minutes to form a hole injection layer 3. At this time, the concentration of the solution, the speed of rotation during spin coating, and the like are controlled, so that the hole injection layer 3 has a thickness of about 60 nm. Then, as in the case of the hole injection layer 3, a solution of a polyfluorene derivative is added by the spin coating method and dried to form a fluorescent layer 4.

Subsequently, a cathode 5 is formed on the fluorescent layer 4. First, using Al containing about 5% by mass of Ca as a vapor deposition source (starting material), a metal layer 6 (thickness of about 10 nm) is formed by the resistance heating vapor deposition method. The metal layer 6 has a striped shape along the direction that is substantially perpendicular to the anode 2 (width: about 2 mm, length: about 5 cm). Thereafter, an IZO layer (thickness: about 100 nm) is formed as a conductive oxide layer 7 by the DC sputtering method. The formation of the IZO layer is preferably performed using an IZO sintered target as a target and using a mixed gas of Ar and $O_2$ as a sputtering gas. Furthermore, the IZO layer is formed to have a stripe pattern that is the same as that of the metal layer 6. Consequently, an organic EL display apparatus of Example 1 is obtained. Furthermore, processing of heating the substrate is not carried out during formation of the metal layer 6 and the oxide conductive (IZO) layer 7.

When a direct-current voltage is applied to the obtained organic EL device of Example 1 so that the Pt electrode 2 is turned anode, and the IZO layer 7 is turned cathode, and emission of light from above the IZO layer 7 is observed, emission of green light from the fluorescent layer 4 is recognized under a fluorescent lamp.

Figure 6A:
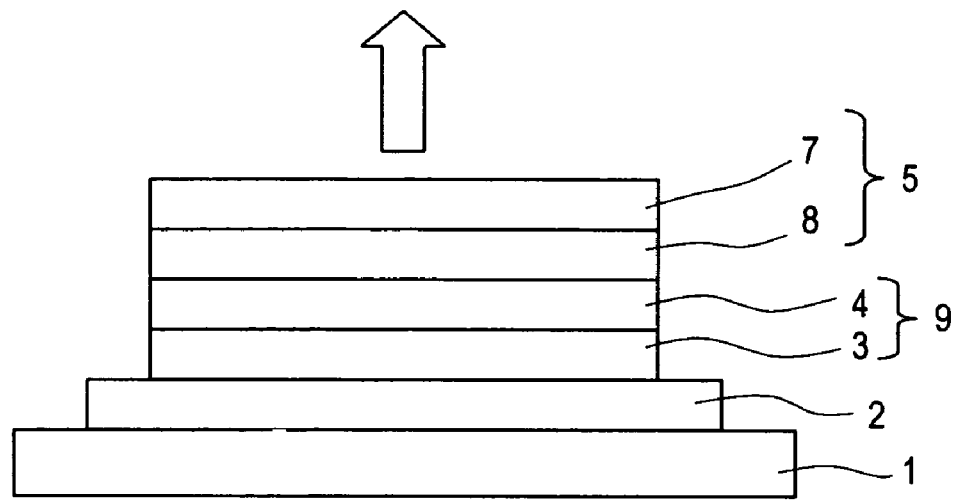
FIGS. 6A and 6B are sectional views each schematically showing the configuration of the organic EL device of a Comparative Example.
Figure 6B:
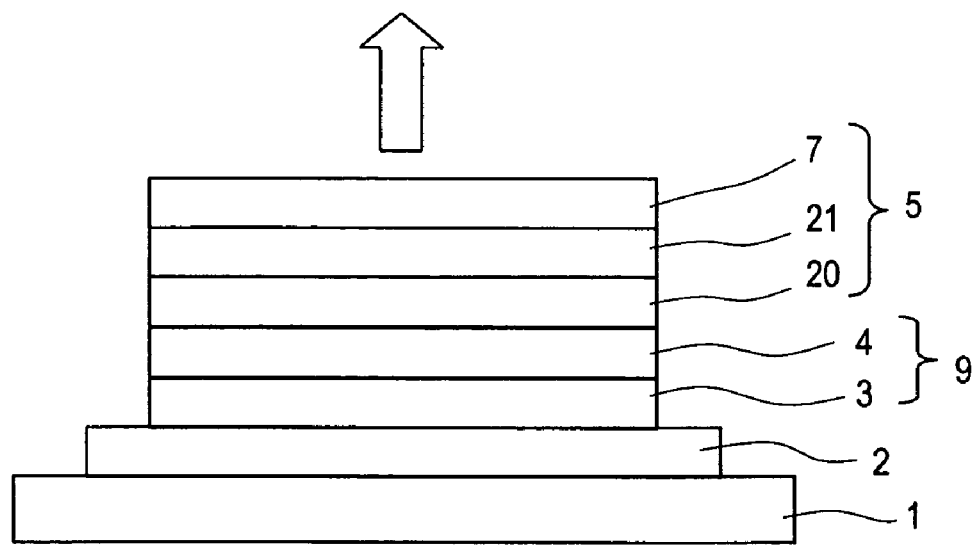

Then, for comparison with the organic EL device of Example 1, organic EL devices of Comparative Examples are fabricated as shown in FIGS. 6A and 6B. The organic EL device of Comparative Example 1 has a configuration that is the same as that of the organic EL device of Example 1 except that it has a Ca layer (thickness: 10 nm) 8 made of Ca alone as a metal layer of the cathode 5 as shown in FIG. 6A, and the organic EL device is fabricated by the same method. The Ca layer 8 is formed by resistance heating vapor deposition. The organic EL device of Comparative Example 2 has a configuration that is the same as that of the organic EL device of Example 1 except that it has a layered structure of a Ca layer (thickness: 5 nm) 20 made of Ca alone and an Al layer (thickness: 5 nm) 21 made of Al alone, and the organic EL device is fabricated by the same method. Furthermore, the Ca layer 20 and the Al layer 21 are each formed by resistance heating vapor deposition.

When a direct-current voltage is applied to each of the organic EL devices of Comparative Examples 1 and 2 so that the Pt electrode 2 is turned anode and the IZO layer 7 is turned cathode, and emission of light from above the IZO layer 7, emission of light (having a low luminance) that is barely recognizable in a dark place can be obtained. Thus, the luminance of light from the organic EL devices of Comparative Examples 1 and 2 is considerably lower than the luminance of light from the organic EL device of Example 1. In other words, the light emission efficiency of the organic EL devices of Comparative Examples 1 and 2 is considerably lower than the light emission efficiency of the organic EL device of Example 1. The current efficiency of the organic EL device of Comparative Example 1 is lower by an order of 2 digits than the current efficiency of the organic EL device of Example 1, and the current efficiency of the organic EL device of Comparative Example 2 is lower by an order of 1.5 digits than the current efficiency of the organic EL device of Example 1.

This can be attributed to the following fact. In the organic EL device of Comparative Example 1, the Ca layer 8 is at least partially oxidized to be converted into an oxide (insulator) with oxygen in a sputtering gas used during formation of the IZO layer 7 and as a result, the electron injection efficiency of the cathode 5 is reduced. Accordingly, sufficient emission of light cannot be obtained in the fluorescent layer 4. Furthermore, in the organic EL device of Comparative Example 2, the Al layer 21 is provided between the Ca layer 20 and the IZO layer 7, whereby oxidation of the Ca layer 20 during formation of the IZO layer 7 can be slightly prevented, and the effect thereof is extremely small compared with the effect obtained when the alloy layer of Ca and Al is formed. Thus, reduction in electron injection efficiency of the cathode 5 resulting from oxidation of the Ca layer 20 cannot be sufficiently prevented.

In contrast, in the organic EL device of Example 1, Ca exists in only a low concentration in an area near the IZO layer 7, and therefore Ca is difficult to be oxidized with oxygen in the sputtering gas used during formation of the IZO layer 7. Furthermore, the metal layer 6 is not a Ca layer made of only Ca susceptible to oxidation, but an alloy layer of Al and Ca. In this way, Ca contained in the alloy is also difficult to be oxidized. Thus, oxygen in the sputtering gas causes no damage to the cathode 5, and therefore the cathode 5 can inject electrons into an organic EL layer 9 with high efficiency.

Analysis of Composition of Metal Layer

For examining in detail the configuration of the metal layer 6 in the organic EL device of Example 1, only a metal layer (thickness of about 10 nm) was formed on a glass substrate (referred to as "metal layer sample 1"), and the composition in the depth direction of the metal layer was analyzed, and the result thereof will be described. The metal layer is formed by a method that is the same as the method of formation of the metal layer 6 in the organic EL device of Example 1 described above. Furthermore, the analysis of the composition of the metal layer is performed using an Auger electron spectrometer.

Figure 2:
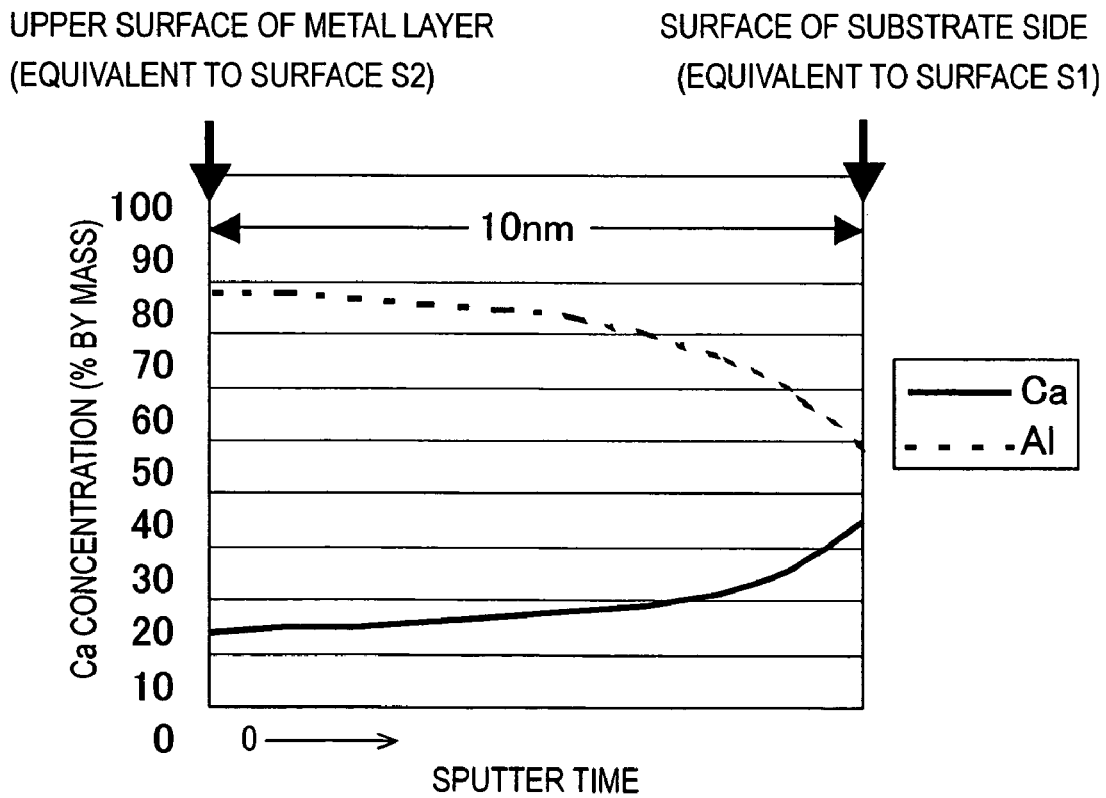
FIG. 2 is a graph showing the composition of a metal layer in the organic EL device of Preferred Embodiment 1.

The result of the analysis of the composition of the metal layer is shown in FIG. 2. From FIG. 2, it can be understood that the concentration of Ca at the surface of the metal layer on the glass substrate 1 side is about 35% by mass. Furthermore, it can be understood that the concentration of deposited Ca decreases as vapor deposition progresses, and the concentration of Ca is about 15% by mass on the upper surface of the metal layer. This can be attributed to the fact that when vapor deposition is carried out with an alloy of Ca and Al as a vapor deposition source, Ca is deposited ahead due to a difference in vapor pressure between Ca and Al. Furthermore, in FIG. 2, the sum of contents of Ca and Al is smaller than 100% by mass, and this is because impurities (not shown) including oxygen as a main component are contained in the metal layer.

Thus, in the organic EL device of Example 1, Ca as the low work function metal exists in a concentration of about 35% by mass in an area near the surface contacting the fluorescent layer 4 of the metal layer 6, and in a concentration of about 15% by mass in an area near the surface contacting the conductive oxide layer 7 of the metal layer 6.

If vapor deposition is carried out with an alloy as a starting material, a metal layer doped with the low work function metal in only one of the areas near the surface with a single vapor deposition source and having the doped concentration of the low work function metal decreased with departure from the surface can be formed. Furthermore, by controlling the content of Ca in the vapor deposition source, the speed of formation of the metal layer (speed of film formation), and timing in which a shutter is opened at the time of vapor deposition, the content of Ca contained in the metal layer 6 and the gradient of the concentration of Ca in the metal layer 6 can be adjusted. Moreover, the content of impurities including oxygen as a main component in the metal layer 6 can be reduced by keeping the pressure at a low level before and during formation of the metal layer 6. In the organic EL device of Example 1, the content of impurities in the metal layer 6 is approximately equal to or greater than the content of Ca. Despite the fact that a relatively large amount of impurities is included, the organic EL device of Example 1 has satisfactory characteristics as described above.

Study of Ca Concentration in Metal Layer 6 (1)

Then, a study of suitable Ca concentrations in the metal layer 6 was performed, and this will be described below. Here, a plurality of sample devices are fabricated while changing the Ca concentration at the surface S1 on the organic EL layer 9 side and the Ca concentration at the surface S2 on the conductive oxide layer side in the metal layer 6, and the relationship between the Ca concentration in each surface and the current efficiency of the sample device is examined to determine a range of suitable Ca concentrations.

First, the sample device is fabricated by a method that is the same as the method of fabrication of the organic EL device of Example 1 described above. However, for changing the Ca concentration in the metal layer 6 for each sample device, metal layer formation conditions such as the Ca concentration in the vapor deposition source, the speed of formation of the metal layer, timing in which the shutter is opened, and so on are selected as appropriate. The thickness of the metal layer 6 is about 10 nm.

Subsequently, using the sample devices, the relationship between the Ca concentrations at the surfaces S1 and S2 of the metal layer 6 and the current efficiency of the sample device (external current efficiency) is examined. The result is shown in Table 1.

TABLE 1

| Sample device No. | Ca concentration in metal layer 6 (% by mass) | | Current efficiency (arbitrary unit) |
| --- | --- | --- | --- |
| | Surface S1 (organic EL layer side) | Surface S2 (conductive oxide layer side) | |
| 1 | 70 | 30 | 0.57 |
| 2 | 50 | 22 | 0.86 |
| 3 | 35 | 15 | 1.00 |
| 4 | 5 | 2 | 0.94 |
| 5 | 3 | 1 | 0.62 |

The current efficiency (Cd/A) of the sample device can be determined from the luminance (unit: cd/cm$^2$) of the device sample measured by a luminance meter, the value of a current (unit: A) passing through the device sample at this time, and the light emission area (unit: m$^2$) of the device. The current efficiencies shown in Table 1 are values standardized with the current efficiency of the sample device No. 3 having the highest current efficiency determined to be 1.

Furthermore, the Ca concentration shown in Table 1 can be determined by a method that is the same as the method using the metal layer sample 1 described in Example 1. That is, metal layers which are the same as those formed for the sample devices are formed to fabricate a plurality of metal layer samples 1. For each of the metal layer samples 1, the Auger electron spectrometer is used to determine the Ca concentration at the surface contacting the glass substrate in the metal layer, and it is determined to be the Ca concentration at the surface S1 of each sample device.

For every sample device, emission of green light from the fluorescent layer 4 is recognized under a fluorescent lamp, and a satisfactory current efficiency is exhibited but as apparent from Table 1, if the Ca concentration at the surface S1 is about 5% by mass to about 50% by mass, an especially satisfactory current efficiency is obtained (sample devices No. 2 to No. 4). The reason for this can be considered in the following way. If the Ca concentration at the surface S1 is about 50% by mass or less, for example, the sample device is not very susceptible to influences of oxygen at the time of formation of the conductive oxide layer 7, water in the atmosphere, and the like. That is, Ca is difficult to be oxidized and as a result, reduction in electron injection efficiency of the metal layer 6 can be reliably prevented. If the Ca concentration at the surface S1 is about 5% by mass or greater, for example, the work function at the surface S1 of the metal layer can be further reduced, thus making it possible to improve the electron injection efficiency of the metal layer 6.

Study of Life Characteristics

Subsequently, life characteristics of the organic EL device of this preferred embodiment were studied, and the results thereof will be described.

Here, an organic EL device of Example 2 is used. The organic EL device of Example 2 has a configuration that is the same as that of the organic EL device of Example 1, and is fabricated by the same method except that an ITO layer is used as the conductive oxide layer 7 instead of an IZO layer. Furthermore, for comparison, an organic EL device of Comparative Example 3 is also fabricated. The organic EL device of Comparative Example 3 has a configuration that is the same as that of the organic EL device of Comparative Example 2 described with reference to FIG. 6B, and is fabricated by the same method except that an ITO layer is used as the conductive oxide layer 7 instead of an IZO layer.

Figure 5:
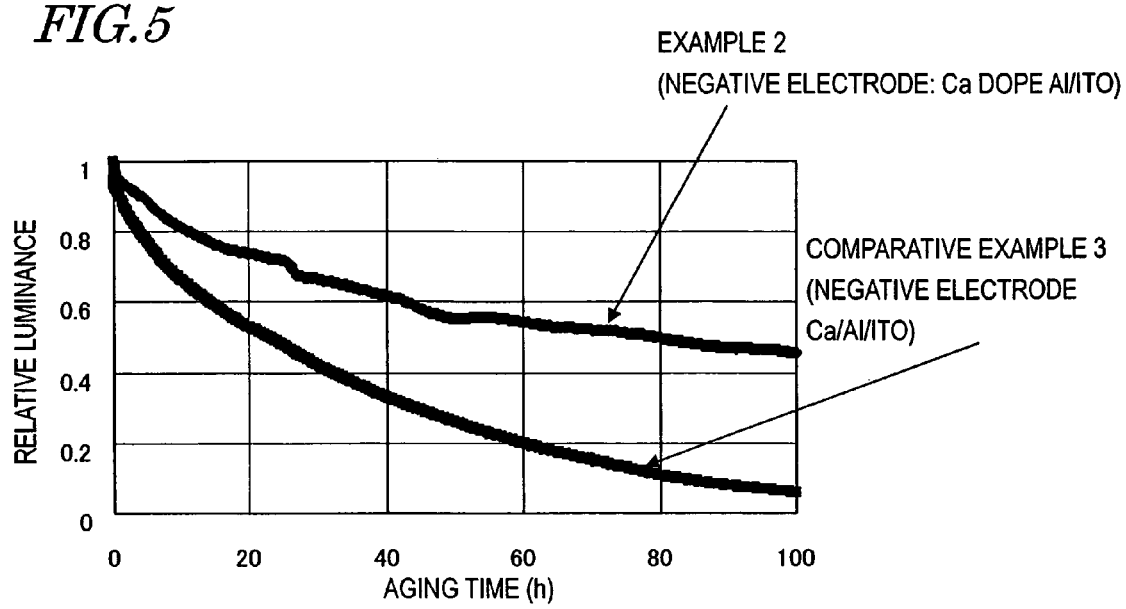
FIG. 5 is a graph showing life characteristics of organic EL devices of Example 2 and Comparative Example 3, respectively.

The results of studies of life characteristics of the organic EL device of Example 2 and the organic EL device of Comparative Example 3 are shown in FIG. 5.

As apparent from FIG. 5, the luminance half-life (i.e., the operating time period after which the initial luminance is reduced by half) of the organic EL device of Example 2 is about 80 hours, while the luminance half-life of the organic EL device of Comparative Example 3 is about 25 hours. From this fact, it can be recognized that if an alloy layer containing Ca is provided as the metal layer 6 in the polymer type organic EL device having a PEDOD/PSS layer 3, the life of the organic EL device increases by a factor of about 3. Furthermore, in the case of the low-molecular type organic EL device having no PEDOT/PSS layer (not shown), a significant difference as shown in FIG. 5 is not observed between the life characteristics of the device having a Ca dope Al layer (alloy layer) as the metal layer 6 and the life characteristics of the device having a layered structure of a Ca layer and an Al layer as the metal layer 6.

From these results, the following considerations can be made. In the organic El device of Comparative Example 3, as described above, sulfur (S) contained in the PEDOT/PSS layer 3 being a hole injection layer reacts with Ca in the Ca layer 20 to generate a metal sulfur compound (CaS, etc.), resulting in a reduction in life characteristics. In contrast, in the organic EL device of Example 2, an alloy layer containing Ca is used as a cathode, whereby generation of the metal sulfur compound described above can be prevented, thus making it possible to prevent a reduction in life characteristics.

Preferred Embodiment 2

The second preferred embodiment of the organic EL device according to the present invention will be described below.

The organic EL device of this preferred embodiment has a configuration that is the same as that of the organic EL device 100 described with reference to FIG. 1. However, the organic EL device of this preferred embodiment and the organic EL device 100 are different in the method of formation of the metal layer 6. In the organic EL device 100, the metal layer 6 is formed using a single vapor deposition source while in this preferred embodiment, the metal layer 6 is formed by co-deposition using multiple sources of a metal as a base material and a low work function metal (multiple vapor deposition sources). First, a vapor deposition boat bearing a metal as a base material (e.g. Al) and a vapor deposition boat bearing a low work function metal (e.g. Ca) are prepared. Then, co-deposition is carried out while the current added to each vapor deposition boat is controlled so that the ratio of the deposition rate of the metal as a base material to the deposition rate of the low work function metal is a desired ratio. Consequently, the metal layer 6 (thickness of about 10 nm, for example) having different concentrations of the low work function metal at the surface S1 and the surface S2.

In the organic EL device of this preferred embodiment, the metal layer 6 is formed by co-deposition, thus making it possible to control the concentration of the low work function metal in the metal layer 6 over a wider range and more accurately. Thus, oxidation of the metal layer 6 is prevented while the work function of the metal layer 6 is kept at a low level, whereby the metal layer 6 having an excellent electron injection efficiency can be more reliably formed.

Study of Ca Concentration in Metal Layer 6 (2)

In this preferred embodiment, a plurality of sample devices which are mutually different in Ca concentration in the metal layer 6 were fabricated, and the relationship between the Ca concentration and the current efficiency of the sample device was studied more in detail, and the result thereof will be described.

Here, the sample devices are fabricated by the following method. First, the anode (Pt) 2, the hole injection layer 3 and the fluorescent layer 4 are sequentially formed on the substrate 1 by the same method using materials which are the same as those of the organic EL device of Example 1. Thereafter, a Ca dope Al layer is formed as the metal layer 6. At this time, first, the Ca concentration at the surface S2 of the metal layer 6 is fixed at about 10% by mass, and the Ca concentration at the surface S1 is changed for each sample device. Similarly, the Ca concentration at the surface S1 is changed for each sample device for the case where the Ca concentration at the surface S2 is fixed at about 30% by mass and about 40% by mass. The Ca concentrations of these sample devices are controlled by conditions of formation of the metal layer 6 (e.g. magnitude of current added to vapor deposition boat). Furthermore, the conditions of formation of the metal layer 6 are previously determined from the results obtained by forming Ca dope Al layers on a glass substrate under various conditions, and determining the Ca concentration in each Ca dope Al layer by the Auger electron spectrometer. Finally, using a material that is the same as that in the organic EL device of Example 1, the conductive oxide layer 7 is formed on the metal layer 6 by the same method.

Figure 3:
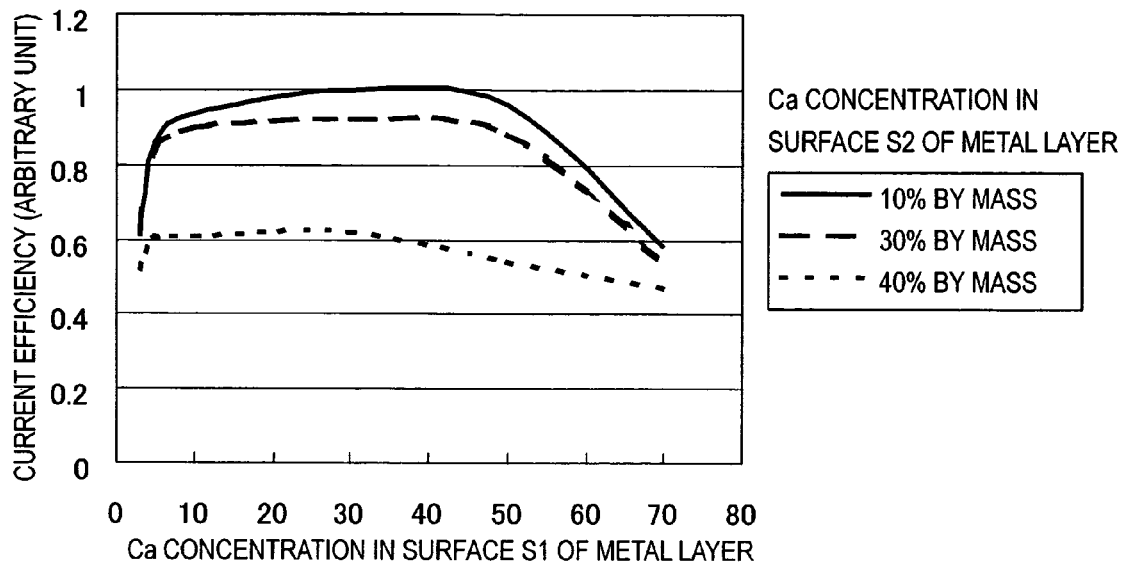
FIG. 3 is a graph showing a relationship between the concentration of Ca in the metal layer and the external current efficiency of the organic EL device.

For each of the obtained sample devices, the current efficiency is measured. The result is shown in FIG. 3. The current efficiencies in FIG. 3 are values standardized with the current efficiency of the sample device having the highest current efficiency in sample devices fabricated by the above method determined to be 1.

As apparent from FIG. 3, sample devices with the Ca concentrations at the surface S2 of the metal layer 6 being about 10% by mass and about 30% by mass have especially satisfactory current efficiencies. As a reason for this, it can be considered that by keeping about 30% by mass or less the amount of Ca existing on the surface 2 as a ground for forming the conductive oxide layer 7, oxidation of Ca with oxygen at the time of formation of the conductive oxide layer 7 and water in the atmosphere can be more effectively prevented.

Furthermore, it can be understood that sample devices with the Ca concentrations at the surface S2 being about 10% by mass and about 30% by mass and the Ca concentrations at the surface S1 in the range of about 5% by mass to about 50% by mass have still higher current efficiencies. As a reason for this, it can be considered that if the Ca concentration at the surface S1 is about 5% by mass or greater, the metal layer 6 has a sufficient amount of Ca for efficiently injecting electrons into the organic EL layer. On the other hand, it can be considered that if the Ca concentration at the surface S1 is about 50% by mass or less, oxidation of Ca with oxygen at the time of formation of the conductive oxide layer 7 and water in the atmosphere is more reliably prevented, and therefore the metal layer 6 is not degraded.

Study of Thickness of Metal Layer 6

Studies of suitable thickness of the metal layer 6 were made, and this will be described below. Here, a plurality of sample devices which are mutually different in thickness of the metal layer (Ca dope Al layer) 6 are fabricated, and the relationship between the thickness of the metal layer 6 and the current efficiency of the sample device (external current efficiency) is examined to determine a range of suitable thickness of the metal layer 6.

The metal layers 6 of these sample devices are formed by the co-deposition method described above. When the metal layer 6 is formed, the deposition rate is adjusted so that the Ca concentration at the surface S1 of the metal layer 6 of the sample device is about 30% by mass, and the Ca concentration at the surface S2 is about 10% by mass. Furthermore, the deposition rate and timing in which a shutter of a vapor deposition boat is closed are selected as appropriate, whereby the thickness of the metal layer 6 in each sample device is controlled. The sample device has a configuration that is the same as that of the organic EL device of Example 1, and is fabricated by the same method except for the above respects.

Figure 4:
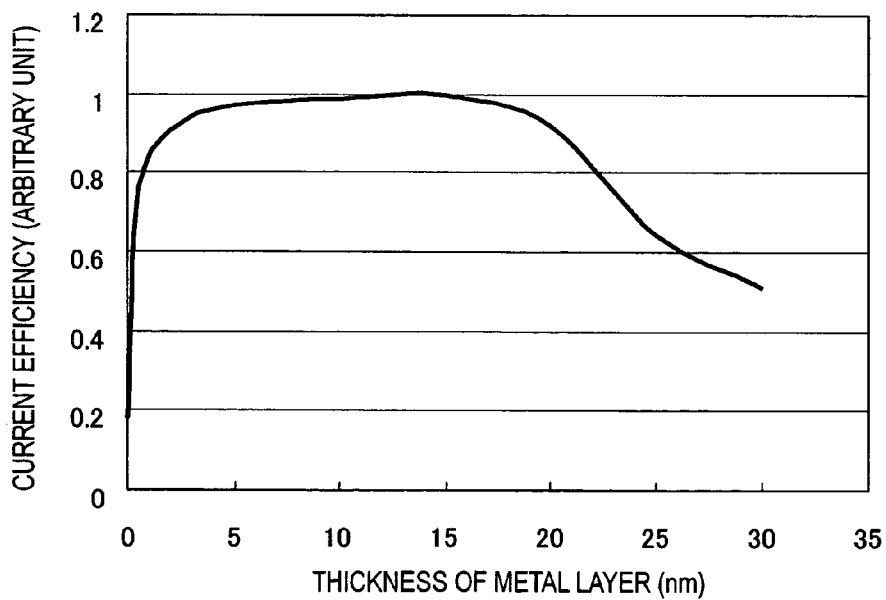
FIG. 4 is a graph showing a relationship between the thickness of the metal layer and the external current efficiency of the organic EL device.

Then, these sample devices are used to examine the relationship between the thickness of the metal layer 6 and the current efficiency of the sample device. The results are shown in FIG. 4. The current efficiencies shown in FIG. 4 are values standardized with the current efficiency of the sample device having the highest current efficiency determined to be 1.

As apparent from FIG. 4, the current efficiency of the organic EL device rapidly increases as the thickness of the metal layer 6 increases from zero even slightly, and it gently decreases as the thickness exceeds about 20 nm. In this way, the reason why the current efficiency gently decreases as the thickness of the metal layer 6 increases is that as the thickness of the metal layer 6 increases, absorption and reflection of light from the fluorescent layer 4 by the metal layer 6 is enhanced, and thus the amount of light transmitting through the metal layer 6 decreases. Furthermore, from FIG. 4, it can be understood that when the thickness of the metal layer 6 is about 0.5 nm to about 20 nm, an organic EL element having an excellent current efficiency can be obtained.

Preferred Embodiment 3

The third preferred embodiment of the organic EL device according to the present invention will be described below with reference to the drawings.

Figure 7:
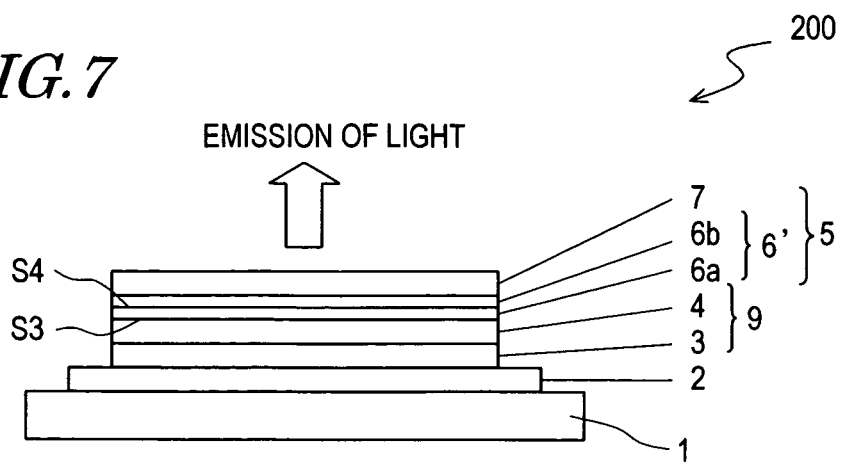
FIG. 7 is a sectional view schematically showing the configuration of the organic EL device of Preferred Embodiment 3 according to the present invention.

An organic EL device 200 shown in FIG. 7 has an anode 2, an organic EL layer 9 and a cathode 5 arranged in that order on a substrate 1. The organic EL layer 9 should only have a fluorescent layer 4, and may be a single layer or have a layered structure. In this preferred embodiment, the organic EL layer 9 has a hole injection layer 3 and the fluorescent layer 4 arranged in this order from the substrate 1 side. In the organic EL device 200, light from the fluorescent layer 4 is extracted from above the cathode 5 (top emission type), and therefore the cathode 5 has optical transparency. The cathode 5 has a structure in which a metal layer 6' and a conductive oxide layer 7 including an oxide are stacked in this order on the organic EL layer 9. The metal layer 6' has a layered structure of a first metal layer 6a including a first metal and a low work function metal and a second metal layer 6b including a second metal. The first and second metals should have work functions that are greater than the work function of the low work function metal. The first and second metals may be the same metal or may be different metals. It is advantageous that the first and second metals are the same because the first and second metal layers 6a and 6b can be formed at the same time. It is preferable that the second metal layer 6b includes substantially no low work function metal, but it may include a low work function metal in a concentration lower than the concentration of the low work function metal in the first metal layer 6a.

In the organic EL device 200, the first metal layer 6a provided on the organic EL layer 9 side includes a low work function metal, thus making it possible to efficiently inject electrons into the organic EL layer 9. Furthermore, the first metal layer 6a is not a metal layer composed of a low work function metal alone, but includes the first metal in addition to the low work function metal, and the second metal layer 6b exists between the first metal layer 6a and the conductive oxide layer 7, whereby oxidation of the low work function metal included in the first metal layer 6a can be effectively prevented during formation of the conductive oxide layer 7. Furthermore, the second metal layer 6b includes substantially no low work function metal or includes only a relatively small amount of low work function metal, and therefore the problem of oxidation of the low work function metal hardly arises. Thus, reduction in light emission efficiency of the organic EL device resulting from oxidation of the low work function metal can be prevented.

If reduction in light emission efficiency can be prevented, power inputted to the organic EL device for realization of a required luminance can be reduced. Thus, a current or voltage applied to the organic EL device can be reduced, degradation of the organic EL device can be therefore prevented and as a result, reliability of the organic EL device can be improved. Furthermore, after formation of the organic EL device, the low work function metal included in the first metal layer 6a exists in only a small amount on the side of the conductive oxide layer 7, and is therefore difficult to be oxidized with oxygen included in the conductive oxide layer 7. Accordingly, degradation of the organic EL device due to growth of resistance of the first metal layer 6a and reduction in electron injection efficiency can be prevented, thus making it possible to improve the reliability of the organic EL device.

The concentration of the low work function metal at the surface S3 of the first metal layer 6a on the side of the organic EL layer 9 is preferably higher than the concentration of the low work function metal at the surface S4 of the first metal layer 6a on the side of the conductive oxide layer 7. Consequently, the low work function metal can be situated at a position farther away from the conductive oxide layer 7, thus making it possible to more effectively prevent oxidation of the low work function metal. Furthermore, the work function of the surface S3 can be reduced to a lower level, thus making it possible to obtain a higher electron injection efficiency. Preferably, the concentration of the low work function metal in the first metal layer 6a is high at the surface S3 and decreases as the surface S4 is approached.

The concentration of the low work function metal at the surface S3 of the first metal layer 6a is preferably about 5% by mass or greater for ensuring a sufficient electron injection efficiency. It is preferable that the concentration of the low work function metal at the surface S3 is about 70% or less because oxidation of the low work function metal can be reliably prevented.

For preventing oxidation of the low work function metal more reliably, the concentration of the low work function metal at the surface S4 of the first metal layer 6a is preferably low, e.g., about 50% by mass or less. It is further advantageous that the concentration of the low work function metal at the surface S4 of the first metal layer 6a is substantially zero.

Preferably, the concentration of the low work function metal in the second metal layer 6b is substantially zero. Consequently, the low work function metal can be made to exist in only an area of the metal layer 6' near the organic EL layer 9 and particularly, oxidation of an electrode metal that is very active and susceptible to oxidation, such as Ca or Ba, which is suitably used for the fluorescent layer 4 having a polymer light emission material, can be effectively prevented. Thus, an organic EL device having satisfactory characteristics, particularly a polymer type organic EL device, can be provided.

The thickness of the metal layer 6' (total thickness of first and second metal layers 6a and 6b) is preferably about 35 nm or less. If the thickness of the metal layer 6' is about 35 nm or less, the ratio of absorption of light from the organic EL layer by the metal layer 6 can be sufficiently reduced, thus making it possible to realize a transparent organic EL panel and an organic EL panel having a top emission structure.

The thickness of the first metal layer 6a is preferably about 0.5 nm to about 10 nm. If the thickness is about 0.5 nm or greater, a sufficient electron injection efficiency can be ensured. If the thickness is about 10 nm or less, oxidation of the first metal layer 6a can be effectively prevented by the second metal layer 6b.

The first and second metals in this preferred embodiment can be used as host metals of the first metal layer 6a and the second metal layer 6b, respectively. Preferably, the first and second metals each includes at least one type of metal selected from the group consisting of Ni, Os, Pt, Pd, Al, Au and Rh. These metals are stable, films formed from these metals are difficult to be have an island structure even with reduced thickness, excellent in coverage characteristics, and excellent in effect of preventing oxidation or the low work function metal, thus making it possible to realize a high efficiency organic EL device.

The low work function metal included in the metal layer 6' may be identical to the low work function metal in Preferred Embodiment 1, and includes at least one type of metal selected from the group consisting of, for example, Ca, Ba, Li and Cs.

The cathode 5 should only include at least one first metal layer 6a, one second metal layer 6b and one conductive oxide layer 7, and each layer may have a layered structure. Furthermore, the cathode 5 may further include other layers that are different in functions from these layers. However, for efficiently injecting electrons into the organic EL layer 9, it is desirable that the first metal layer 6a should contact the organic EL layer 9.

By forming the organic EL device of this preferred embodiment on an active matrix substrate, a display apparatus of an active matrix system that is excellent in display characteristics can be formed.

The configuration of the organic EL layer 9 and the method for formation of the same may be the same as the configuration and formation method described in Preferred Embodiment 1, for example. Materials of the fluorescent layer 4, the hole injection layer 3 and the charge transport layer constituting the organic EL layer 9, and the method for formation of these layers may be the same as the materials and formation method described in Preferred Embodiment 1. In addition the materials and configuration of the anode 2 may be the same as the materials and formation method described in Preferred Embodiment 1.

If the fluorescent layer 4 of the polymer light emission material is formed, Ca and Ba are suitably used as the low work function metal included in the metal layer 6' of the cathode 5. By doping a host metal (first metal) with the low work function metal, the first metal layer 6a can be formed. The first metal layer 6a is preferably formed using a chemically relatively stable metal, e.g. Ni, Os, Pt, Pd, Al, Au or Rh as the first metal. Consequently, not only oxidation of the low work function metal included in the first metal layer 6a is prevented, but also the first metal layer 6a itself is not oxidized, and the second metal layer 6b does not react with the first metal layer 6a, thus making it possible to prevent degradation of the cathode 5. Furthermore, the second metal layer 6b preferably includes a metal that is the same as the host metal of the first metal layer 6a illustrated above. Further, the first and second metal layers 6a and 6b preferably have a transmittance of about 10% or greater over the entire visible light region. For example, a Ni film (thickness of about 35 nm) formed on a synthetic quartz substrate by the electron beam vapor deposition method was shown to be excellent in coverage characteristics because it had a transmittance of about 10% over the entire visible light region, and had no island form in observation of the surface morphology by a scanning electron microscope. Films composed of other materials described above were shown to have more or less satisfactory transmittances and coverage characteristics. Furthermore, for forming a film having no island structure, a metal material that is difficult to cause an island structure is preferably selected as the host metal depending on the formation method and thickness. It was ensured in the above-described experiment that use of, for example, Ni, Al or the like as the host metal could form a film having no island structure even if it had a small thickness. Furthermore, materials (Os, Pd, etc.) for use in thin film coating are generally difficult to cause an island structure, and therefore can be used as host metals of the above-described metal layers 6a and 6b.

The configuration of the organic EL device of various preferred embodiments of the present invention is especially advantageous if applied to the polymer type organic EL device. This is because for injecting electrons into the fluorescent layer 4 including a polymer light emission material, a metal having a lower work function is required as described previously, and oxidation of such a metal can be prevented. The organic EL device 200 of FIG. 7 is a top emission type, but may be a bottom emission type.

It is further advantageous that preferred embodiments of the present invention are applied to the polymer type organic EL device having a PEDOT/PSS layer as the hole injection layer as described in Preferred Embodiment 1.

EXAMPLE 3

An organic EL device of Example 3 (FIG. 7) is preferably fabricated by the following method.

First, the anode 2, the hole injection layer 3 and the fluorescent layer 4 are formed on the substrate 1 using the same materials and method as in Example 1. The sizes of the layers are also the same as the sizes in Example 1.

Subsequently, the cathode 5 is formed on the fluorescent layer 4. First, using Al containing about 5% by mass of Ca as a vapor deposition source (starting material), the metal layer 6' (thickness of about 15 nm) is formed by the resistance heating vapor deposition method. The metal layer 6' has a striped shape along the direction that is substantially perpendicular to the anode 2 (width of about 2 mm, length of about 5 cm). An area of the formed metal layer 6' where Ca exists is limited to an area extending from the surface of the metal layer 6' on the fluorescent layer side 4 to a predetermined thickness (first metal layer 6a), and the other area of the metal layer 6' (second metal layer 6b) contains substantially no Ca. Thereafter, an IZO layer is formed as the conductive oxide layer 7 by the DC sputtering method. The method for formation of the IZO layer is the same as the method in Example 3. Consequently, an organic EL display apparatus of Example 3 is obtained. Processing of heating the substrate is not carried out during formation of the metal layer 6 and the oxide conductive (IZO) layer 7.

Then, for comparison with the organic EL device of Example 3, an organic EL device of Comparative Example 4 having a configuration shown in FIG. 6A is fabricated. The organic EL device of Comparison Example 4 has a configuration that is same as that of the organic EL device of Example 3 except that it has a Ca layer (thickness of about 15 nm) 8 made of Ca alone as the metal layer of the cathode 5, and is fabricated by the same method. The Ca layer 8 is formed by the resistance heating vapor deposition method.

A direct-current voltage is applied to each of the organic EL devices of Example 3 and Comparative Example 4 obtained as described above so that the Pt electrode 2 is turned anode and the ITO layer 7 is turned cathode, and emission of light from above the ITO layer 7 occurs. As a result, emission of green light from the fluorescent layer 4 is recognized under a fluorescent lamp for the organic EL device of Example 3, but emission of light (having a low luminance) that is barely recognizable in a dark place is obtained for the organic EL device of Comparative Example 4. Thus, the luminance of light from the organic EL device of Comparative Example 4 is considerably lower than the luminance of light from the organic EL device of Example 3. In other words, the light emission efficiency of the organic EL device of Comparative Example 4 is considerably lower than the light emission efficiency of Example 3.

This can be attributed to the following fact. In the organic EL device of Comparative Example 4, the Ca layer 8 is at least partially oxidized to be formed into an oxide (insulator) with oxygen in a sputtering gas used during formation of the IZO layer 7 and as a result, the electron injection efficiency of the cathode 5 is reduced. Accordingly, sufficient emission of light cannot be obtained in the fluorescent layer 4. In the organic EL device of Example 3, Ca exists only near the interface with the organic EL layer 9, and is therefore difficult to be oxidized with oxygen in the sputtering gas used during formation of the IZO layer 7. For explaining more in detail, oxygen in the sputtering gas does not react with the relatively stable second metal layer (Al layer) 6b, and is hampered by the Al layer and thus hardly reaches the first metal layer 6a being an alloy layer of Al and Ca. Moreover, since the first metal layer 6a is not a Ca layer made of only Ca that is susceptible to oxidation, but an alloy layer of Al and Ca, Ca included in the first metal layer is also difficult to be oxidized. Thus, oxygen in the sputtering gas causes no damage to the cathode 5 (especially the first metal layer 6a), and therefore the cathode 5 can inject electrons into the organic EL layer 9 with high efficiency.

Analysis of Composition of Metal Layer

For examining in detail the configuration of the metal layer 6' in the organic EL device of Example 3, only a metal layer (thickness of about 15 nm) was formed on a glass substrate (referred to as "metal layer sample 2"), and the composition in the depth direction of the metal layer was analyzed, and the result thereof will be described. The metal layer is formed by a method that is the same as the method of formation of the metal layer 6' in the organic EL device of Example 3 described above. Furthermore, the analysis of the composition of the metal layer is performed using an Auger electron spectrometer.

Figure 8:
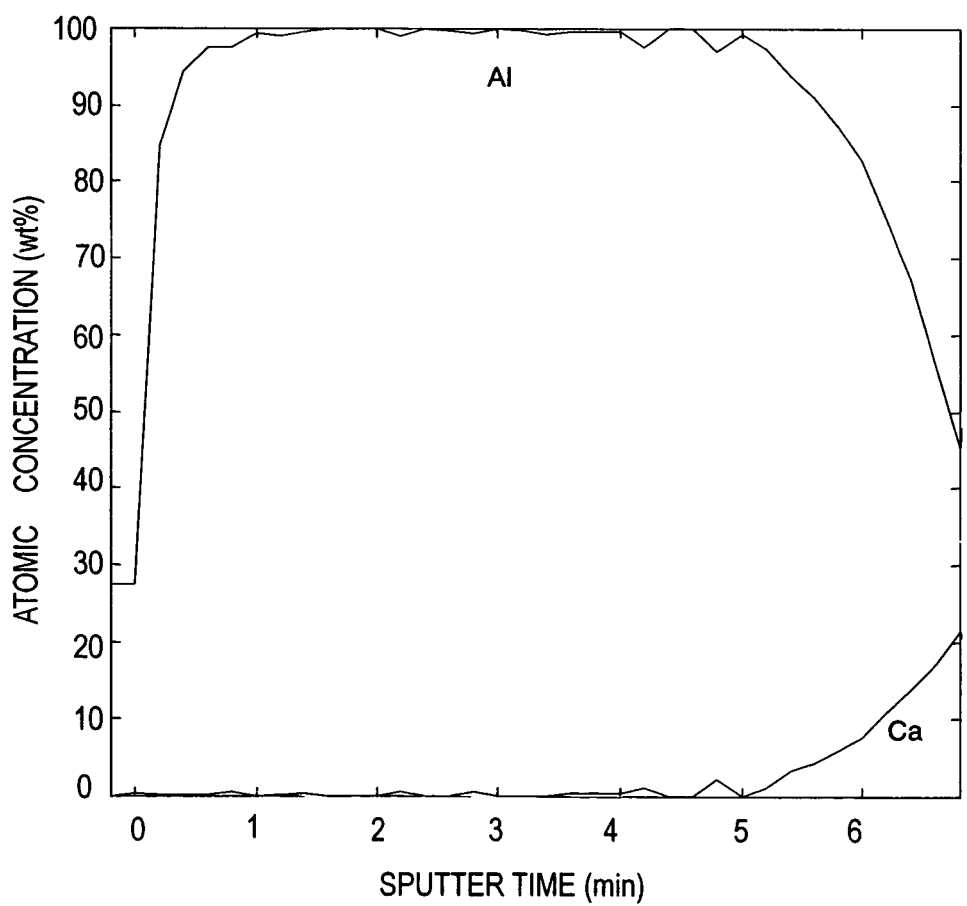
FIG. 8 is a graph showing the composition of the metal layer in the organic EL device of Example 3.

As a result of analysis of the composition of the metal layer, the concentration of Ca at the surface of the metal layer on the glass substrate 1 side is about 20% as shown in FIG. 8. Furthermore, it can be recognized that the area of the metal layer where Ca exists is an area extending from the surface of the metal layer on the glass substrate 1 side to about ⅓ of the total thickness of the metal layer. Further, it can be understood that Ca and Al are deposited onto the glass substrate 1 in the early stage of vapor deposition, the concentration of deposited Ca decreases as vapor deposition progresses, and substantially only Al is deposited after a certain time period has elapsed. This can be attributed to the fact that when vapor deposition is carried out with an alloy of Ca and Al as a vapor deposition source, Ca is deposited ahead due to a difference in vapor pressure between Ca and Al.

Thus, it can be recognized that in the organic EL device of Example 3, Ca being the low work function metal exists only near the surface of the metal layer 6' contacting the fluorescent layer 4. In the organic EL device of Example 3, the "first metal layer 6a" including Ca and the "second metal layer 6b" (made of substantially only Al) containing no Ca constitute the metal layer 6.

In this way, if an alloy is used as a starting material, a metal layer doped with the low work function metal in only one of the areas near the surface with a single vapor deposition source and having the doped concentration of the low work function metal decreased with departure from the surface can be conveniently formed. Furthermore, by controlling timing in which a shutter is opened (i.e., timing in which vapor deposition is started), the thickness of the area (first metal layer 6a) where the low work function metal is doped can be controlled. Further, by changing the Ca concentration in the vapor deposition source, the dope concentration of the low work function metal in the first metal layer 6a can be controlled.

Study of Life Characteristics

Subsequently, life characteristics of the organic EL device of this preferred embodiment were studied, and the result thereof will be described.

Here, an organic EL device of Example 4 is used. The organic EL device of Example 4 has a configuration that is the same as that of the organic EL device of Example 3, and is fabricated by the same method except that an ITO layer is used as the conductive oxide layer 7 instead of an IZO layer.

Furthermore, for comparison, an organic EL device of Comparative Example 5 having a configuration shown in FIG. 6B is fabricated. The organic EL device of Comparative Example 5 has a layered structure of a Ca layer (thickness of about 5 nm) 20 made of Ca alone and an Al layer (thickness of about 10 nm) 21 made of Al alone as the metal layer. Furthermore, it has an ITO layer as the conductive oxide layer 7. Except for these aspects, the organic EL device of Comparative Example 5 has a configuration that is the same as that of the organic EL device of Example 3, and is fabricated by the same method.

Figure 9:
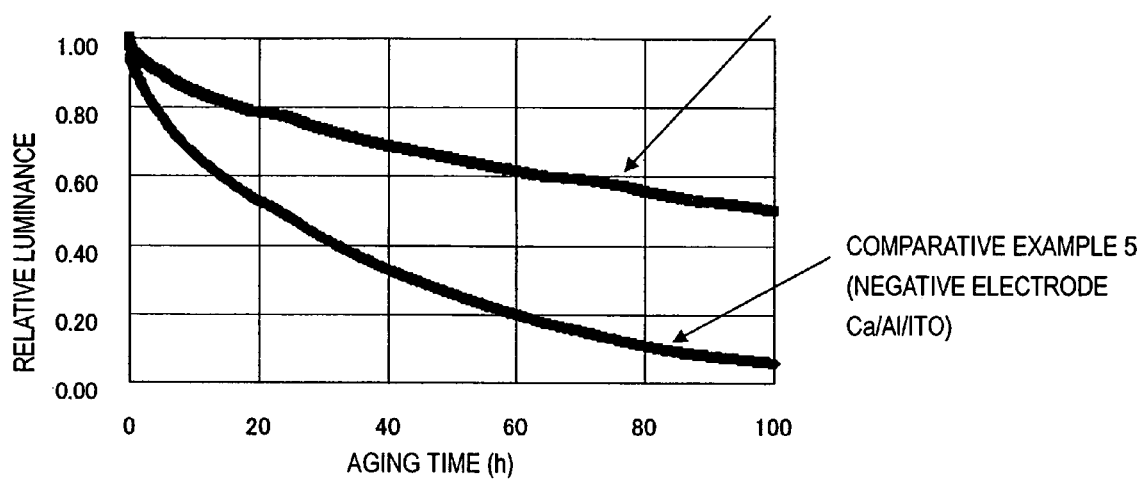
FIG. 9 is a graph showing life characteristics of organic EL devices of Example 4 and Comparative Example 5, respectively.

The results of examination of life characteristics of the organic EL device of Example 4 and the organic EL device of Comparison Example 5 are shown in FIG. 9.

As apparent from FIG. 9, the luminance half-life of the organic EL device of Example 4 is about 90 hours, while the luminance half-life of the organic EL device is about 25 hours. From this fact, it can be recognized that if an alloy layer including Ca is provided as the metal layer 6' in the polymer type organic EL device having a PEDOD/PSS layer 3, the life of the organic EL device increases by a factor of about 3 or greater. Furthermore, in the case of the low-molecular type organic EL device having no PEDOT/PSS layer (not shown), a significant difference as shown in FIG. 9 is not observed between the life characteristics of the device having a Ca dope Al layer (alloy layer) as the metal layer 6' and the life characteristics of the device having a layered structure of a Ca layer and an Al layer as the metal layer 6'.

From these results, the following conclusions can be reached. In the organic El device of Comparative Example 5, as described above, sulfur (S) contained in the PEDOT/PSS layer 3 being a hole injection layer reacts with Ca in the Ca layer 20 to generate a metal sulfur compound (CaS, etc.), resulting in a reduction in life characteristics. In contrast, the organic EL device of Example 4 has an alloy layer containing Ca near the organic EL layer 9 in the cathode. Ca contained in the alloy layer is difficult to react with S, and therefore generation of the metal sulfur compound at the interface between the cathode 5 and the organic EL layer 9 is prevented, thus making it possible to prevent a reduction in life characteristics.

Preferred Embodiment 4

The fourth preferred embodiment of the organic EL device according to the present invention will be described below.

The organic EL device of this preferred embodiment has a configuration that is the same as that of the organic EL device 200 described with reference to FIG. 7. However, the organic EL device of this preferred embodiment and the organic EL device 200 are different in the method of formation of the metal layer 6'. In the organic EL device 200, the metal layer 6' is preferably formed using a single vapor deposition source, while in this preferred embodiment, the metal layer 6' is preferably formed by co-deposition using multiple sources of a metal as a base material and a low work function metal (multiple vapor deposition sources). First, a vapor deposition boat bearing a metal as a base material (e.g. Al) and a vapor deposition boat bearing a low work function metal (e.g. Ca) are prepared. Then, co-deposition is carried out while the current added to each vapor deposition boat is controlled so that the ratio of the deposition rate of the metal as a base material to the deposition rate of the low work function metal is a desired ratio. In this way, the first metal layer 6a (thickness of about 10 nm, for example) is formed. Then, only the shutter of the vapor deposition boat bearing the low work function metal is closed, and only a metal as a base material is deposited to form the second metal layer 6b.

In the organic EL element of this preferred embodiment, the metal layer 6' is formed by co-deposition, the concentration of the low work function metal in the metal layer 6' can be controlled over a wider range and more accurately. Thus, oxidation of the metal layer 6' is prevented while the work function of the metal layer 6' is kept at a low level, whereby the metal layer 6' having an excellent electron injection efficiency can be more reliably formed.

Study of Ca Concentration

Then, studies of suitable Ca concentrations in the first metal layer 6a were made, and this will be described below. Here, a plurality of sample devices are fabricated while changing the Ca concentration at the surface S3 of the first metal layer 6a on the side of the organic EL layer 9, and the relationship between the Ca concentration at the surface S3 and the current efficiency of the sample device is examined to determine a range of suitable Ca concentrations.

First, the sample device is fabricated by a method that is the same as the method for fabrication of the organic EL device of Example 3 described above. However, for almost equalizing the Ca concentration and thickness of the first metal layer (Ca dope Al) 6a in the plurality of sample devices, each first metal layer 6a is formed by co-deposition. That is, Al and Ca are placed in separate vapor deposition boats, and the current passed through each vapor deposition boat is controlled so that the ratio of the deposition rate between Al and Ca is a desired ratio. When the deposition rate is stabilized at the desired ratio, the shutter is opened to start deposition. When the thickness of the Ca dope Al layer formed by deposition reaches a desired thickness, only the shutter of the vapor deposition boat bearing Ca is closed. Thereafter, the layer (second metal layer) 6b made of Al alone is formed on the Ca dope Al layer (first metal layer 6a) because the shutter of the vapor deposition boat bearing Al is opened. In this way, the thickness and concentration of each metal layer can be accurately controlled if co-deposition is used.

Subsequently, using these device samples, the relationship between the Ca concentration at the surface S3 of the first metal layer 6a and the current efficiency of the device sample (external current efficiency) is examined. The result is shown in FIG. 10.

The current efficiency (Cd/A) of the device sample can be determined from the luminance (unit: cd/cm$^2$) of the device sample measured by a luminance meter, the value of a current (unit: A) passing through the device sample at this time, and the light emission area (unit: m$^2$) of the device.

Figure 10:
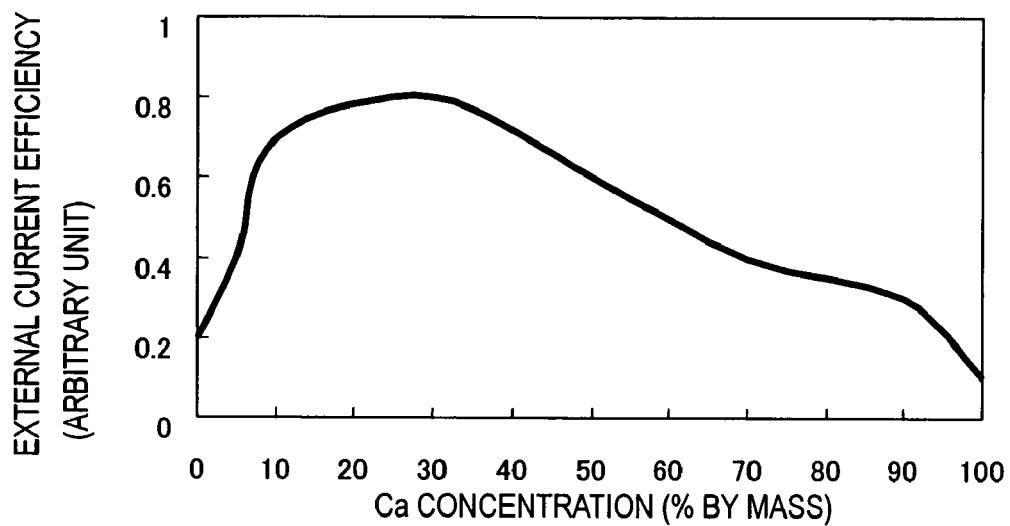
FIG. 10 is a graph showing a relationship between the concentration of Ca on the surface on the organic EL layer side of a first metal layer and the external current efficiency of the organic EL device.

Furthermore, the Ca concentration shown in FIG. 10 can be determined by a method that is the same as the method using the metal layer sample 2 described in Example 3. That is, first metal layers 6a which are the same as those formed for the sample devices are formed to fabricate a plurality of metal layer samples 2. For each of the metal layer samples 2, the Auger electron spectrometer is used to determine the Ca concentration at the surface contacting the glass substrate in the first metal layer 6a, and it is determined to be the Ca concentration at the surface S3 of each sample device.

As apparent from FIG. 10, an organic EL device having a sufficient current efficiency (i.e., sufficient light emission efficiency) is obtained when the Ca concentration at the surface S3 is about 5% by mass to about 70% by mass. It can be considered that if the Ca concentration is less than about 5%, the work function at the surface S3 is not sufficiently small, and therefore the efficiency of injection of electrons into the organic EL layer 9 decreases, resulting in a reduction in current efficiency of the organic EL device. It can be considered that if the Ca concentration at the surface S3 is greater than about 70%, Ca contained in the first metal layer 6a is more susceptible to oxidation when the conductive oxide layer (IZO layer) 7 is formed, and therefore the first metal layer 6a is degraded, resulting in a reduction in current efficiency. Furthermore, as shown in FIG. 3, it can be understood that when the Ca concentration at the surface S3 is about 10% to about 40%, the current efficiency further increases, and thus a high efficiency organic EL device is obtained.

Study of Thickness of First Metal Layer 6a

Studies of suitable thickness of the first metal layer 6a were made, and this will be described below. Here, a plurality of sample devices having different thicknesses of the first metal layer (Ca dope Al layer) 6a are fabricated, and the relationship between the thickness of the first metal layer 6a and the current efficiency of the sample device (external current efficiency) is examined to determine a range of suitable thickness of the first metal layer 6a.

Metal layers 6 of these sample devices are formed by the co-deposition described above. At this time, the thickness of the first metal layer 6a of each sample device is controlled by timing in which the shutter of the vapor deposition boat bearing Ca is closed. Furthermore, the Ca concentration of the first metal layer 6a is about 20%, and the thickness of the second metal layer (Al layer) 6b is about 20 nm. These sample devices each have a configuration that is the same as that of the organic EL device of Example 3 and is fabricated by the same method except for the above-described aspects.

Then, these sample devices are used to examine the relationship between the thickness of the first metal layer 6a and the current efficiency of the sample device. The result is shown in FIG. 11.

Figure 11:
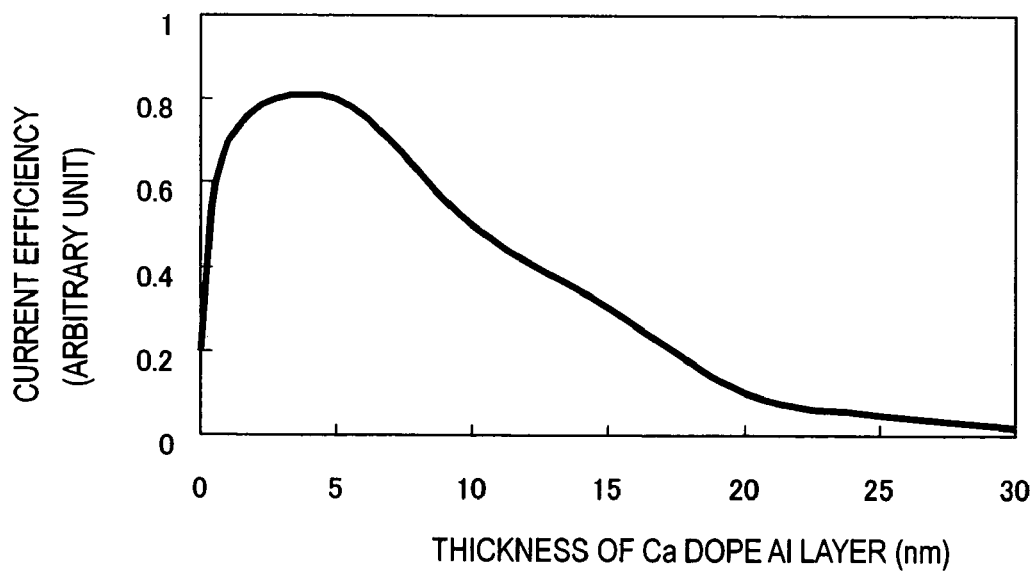
FIG. 11 is a graph showing the thickness of the first metal layer and the external current efficiency of the organic EL device.

As apparent from FIG. 11, the current efficiency of the organic EL device rapidly increases as the thickness of the first metal layer 6a increases from zero even slightly, and it gently decreases as the thickness exceeds about 5 nm. The reason why the current efficiency gently decreases as the thickness of the first metal layer 6a increases in this way is that as the thickness of the first metal layer 6a increases, absorption of light from the emission layer 4 by the first metal layer 6a increases. Furthermore, from FIG. 4, it can be understood that when the thickness of the first metal layer 6a is about 0.5 nm to about 10 nm, an organic EL device having a sufficient current efficiency is obtained.

Preferred Embodiment 5

The configuration of a display apparatus using the above-described organic EL device will be described below with reference to FIGS. 12A and 12B.

Figure 12A:
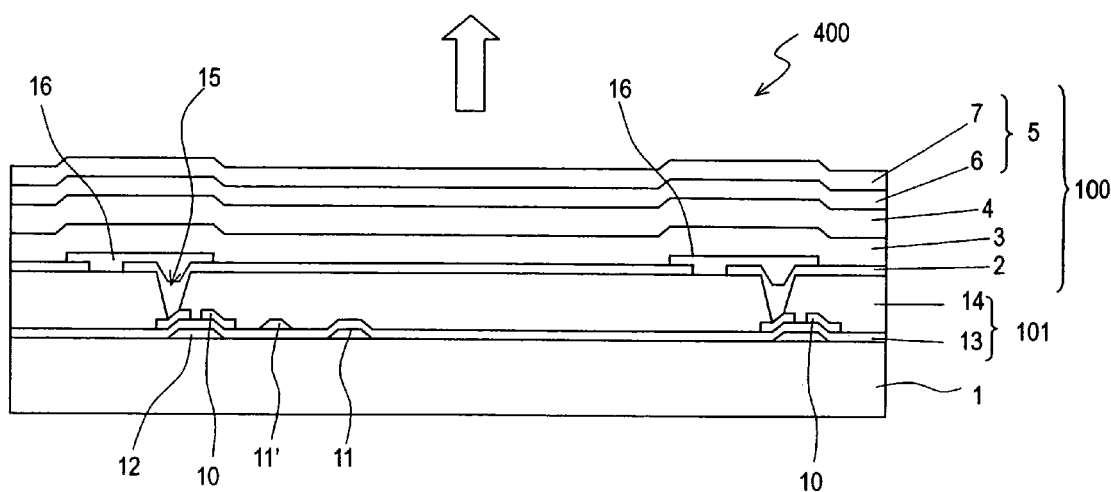
FIGS. 12A and 12B are sectional views each schematically showing the configuration of an organic EL display apparatus of Preferred Embodiment 5 according to the present invention.

In a display apparatus 400 of FIG. 12A, an organic EL device 100 is provided on an active matrix substrate 101. The active matrix substrate 101 has a substrate 1, a plurality of TFTs each formed on the substrate 1 for each pixel, and a planarizing film 14 covering these TFTs. Each TFT has a gate electrode 12, an island semiconductor layer (not shown) formed on the gate electrode 12 through a gate insulation film 13, and a TFT electrode (source, drain electrode) 10 arranged to cover both ends of the island semiconductor layer (bottom gate structure). Each TFT is connected to a source wire 11' and a gate wire 11. The planarizing film 14 is provided with a through-hole 15 reaching the drain electrode 10 of each TFT. The organic EL device 100 is formed on the planarizing film 14. Anodes 2 of the organic EL device 100 are formed for each pixel by patterning a conductive layer deposited on the planarizing film 14 and in the through-hole 15. Each anode 2 is connected to the drain electrode 10 of the corresponding TFT via the through-hole 15. These anodes 2 are mutually insulated by an insulation film 16 arranged to cover the edge of each electrode 2 and the through-hole 15. On the electrode 2 and the insulation film 16, a hole injection layer 3, a fluorescent layer 4, a metal layer (Ca dope Al layer) 6 and a conductive oxide layer (IZO layer) 7 are formed in this order.

Figure 12B:
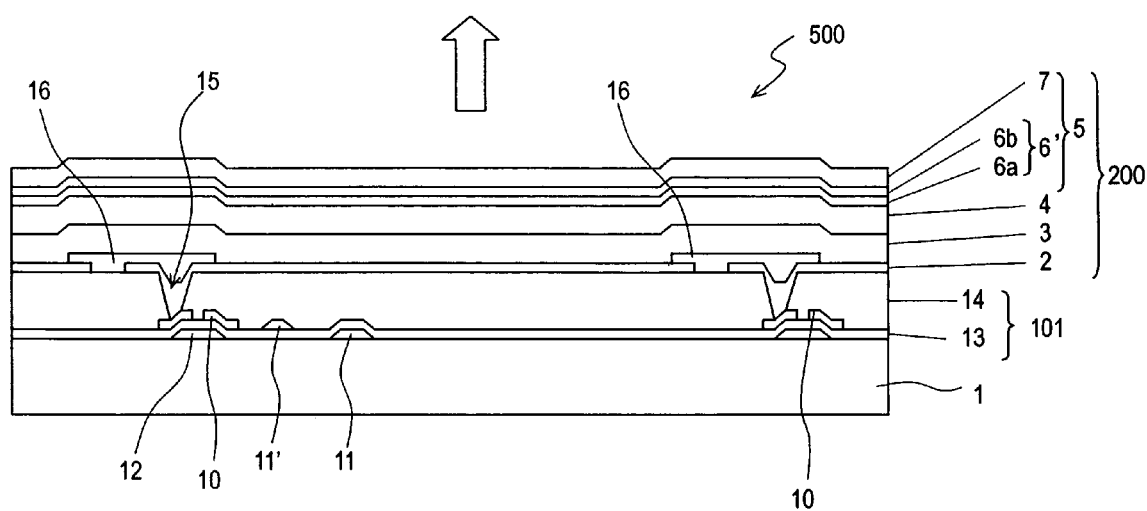

As shown in FIG. 12B, the organic EL device 200 described with reference to FIG. 7 may be used instead of the organic EL device 100. A display apparatus 500 shown in FIG. 12B has a configuration that is the same as that of the display apparatus 400 except that the organic EL device 200 is formed on the planarizing film 14. The anode 2 of the organic EL device 200 is formed for each pixel by patterning a conductive layer deposited on the planarizing film 14 and in the through-hole 15. Each anode is connected the drain electrode 10 of the corresponding TFT via the through-hole 15. These anodes 2 are mutually insulated by the insulation film 16 formed to cover the edge of each anode 2 and the through-hole 15. On the anode 2 and the insulation film 16, a hole injection layer 3a, the fluorescent layer 4, a first metal layer 6a, a second metal layer 6b and the conductive oxide layer (IZO layer) 7 are formed in this order.

The display apparatuses 400 and 500 of FIGS. 12A and 12B have the above-described configuration, and therefore have a high light emission efficiency by preventing a reduction in electron injection efficiency resulting from oxidation of the low work function metal. Accordingly, fine and bright display can be realized. Furthermore, variations in luminance per pixel (i.e., per organic EL device 100) are small, and high quality display is obtained. Further, the display apparatuses 400 and 500 are capable of preventing degradation of the first metal layer 6a in the organic EL devices 100 and 200, and therefore have high reliability.

The configuration of the display apparatus according to the present invention is not limited to the preferred embodiments described above. For example, the TFT may have a top gate structure. The configurations of the organic EL devices 100 and 200 are not limited to those described above, and various configurations described with reference to FIG. 1 may be applied. Furthermore, a display apparatus of the simple matrix system may be formed using the organic EL device 100 or 200. Further, for the display apparatuses 400 and 500, the voltage drive system requiring 2 TFTs for each pixel may be used, or the current drive system requiring 4 TFTs for each pixel may be used.

EXAMPLE 5

The organic EL display apparatus of Example 5 has a configuration shown in FIG. 12A. Example 5 is fabricated by the following method.

A TFT using polysilicon is formed as a semiconductor layer on the insulative substrate 1, and then the TFT is covered with the planarizing film 14 for eliminating irregularities on the surface of the substrate 1. Then, an Ni layer 2 is formed on the planarizing film 14 and in the through-hole 15 provided in the planarizing film 14. The Ni layer is connected to the drain electrode 10 of the TFT by the through-hole 15. A portion of the Ni layer formed on the planarizing film 14 has a thickness of about 150 nm. After formation of the Ni layer, a NiO film (thickness of about 1 nm) is formed on the surface of the Ni layer by the plasma oxidation method (not shown). In this way, the anode 2 is formed. Then, a SiO$_2$ film is formed to cover the through-hole 15 and the edge of the Ni electrode 2. Subsequently, the hole injection layer (thickness of about 60 nm) 3 and the fluorescent layer 4 are formed in this order on the substrate by a method that is the same as the method described with reference to FIG. 1.

Thereafter, the first metal layer 6a having optical transparency is formed on the fluorescent layer 4 by co-deposition of Al and Ca. Al is deposited by the electron beam vapor deposition method and Ca is deposited by the resistance heating vapor deposition method. First, deposition of Al and Ca is started at a time while controlling the ratio of the deposition rate between Al and Ca to be about 70:30 so that the Ca concentration at the surface S1 is about 30% by mass. Thereafter, the deposition rate of Ca is gradually decreased, and the ratio of the deposition rate between Al and Ca is controlled to be about 90:10 so that the Ca concentration at the surface S2 is about 10% by mass at the time when deposition is completed. In this way, a Ca dope Al layer (thickness of about 10 nm) 6 doped with Ca can be formed as the first metal layer 6a. Finally, the IZO layer (thickness of about 100 nm) 7 is formed by a method that is the same as the method described with reference to FIG. 1.

When a control signal is applied to the TFT of the obtained display apparatus of Example 5, emission of green light from the fluorescent layer 4 is observed from above the IZO layer 7. Thus, it can be recognized that oxidation in the metal layer 6 of the organic EL device 100 is sufficiently prevented.

EXAMPLE 6

The organic EL display apparatus of Example 6 has a configuration shown in FIG. 12B. Example 6 is fabricated by the following method.

First, the TFT, the planarizing film 14, the anode 2, the SiO2 film, the hole injection layer 3 and the fluorescent layer 4 are formed on the insulative substrate 1 using the same materials and the same method as in Example 5. The sizes of the layers are the same as the sizes in Example 3.

Then, the metal layer (thickness of about 15 nm, for example) 6 having optical transparency is formed on the fluorescent layer 4 by co-deposition of Al and Ca. Al is deposited by the electron beam vapor deposition method and Ca is deposited by the resistance heating vapor deposition method. First, deposition of Al and Ca is started at a time while performing control so that the ratio of the deposition rate between Al and Ca is about 90:10. Thereafter, the shutter of the vapor deposition boat bearing Ca is closed to finish deposition of Ca, and Al is further deposited. In this way, the Ca dope Al layer (Ca concentration at the surface S3 of about 10%) 6a doped with Ca and the Al layer 6b made of Al alone can be formed. Finally, the IZO layer (thickness of about 100 nm) 7 is formed by a method that is the same as the method described with reference to FIG. 1.

When a control signal is applied to the TFT of the obtained display apparatus of Example 6, emission of green light from the fluorescent layer 4 is observed from above the IZO layer 7. Thus, it can be recognized that oxidation in the first metal layer 6a of the organic EL device 200 is sufficiently prevented.

According to various preferred embodiments of the present invention, oxidation of the low work function metal included in the metal layer is reliably prevented while keeping at a low level the work function at the surface on the organic EL layer side of the metal layer constituting the cathode, thus making it possible to form a cathode having a satisfactory electron injection efficiency. As a result, the light emission efficiency of the organic EL device is greatly improved. Furthermore, degradation in characteristics of the organic EL device can be prevented, and therefore the reliability of the organic EL device can be improved.

The present invention is suitably applicable to the polymer type organic EL device. In the polymer type organic EL device, the cathode is formed using a metal having a smaller work function, and thus, oxidation of such a metal can be effectively prevented.

Furthermore, the present invention is suitably applicable to the top emission type organic EL device. Further, if such an organic EL device is used in the display apparatus of the active matrix system, a remarkable effect is obtained.

This non-provisional application claims priority under 35 USC § 119(a) of Patent Application No. 2003-367646 filed in Japan on Oct. 28, 2003, and Patent Application No. 2003-367647 filed in Japan on Oct. 28, 2003, the entire contents of which are hereby incorporated by reference.

While preferred embodiments of the present invention have been described above, it is to be understood that variations and modifications will be apparent to those skilled in the art without departing the scope and spirit of the invention. The scope of the invention, therefore, is to be determined solely by the following claims.

What is claimed is:

1. An organic EL device comprising:
    an anode electrode;
    a cathode electrode having optical transparency; and
    an organic EL layer disposed between said anode electrode and said cathode electrode and including at least a fluorescent layer; wherein
    said cathode electrode has a metal layer and a conductive oxide layer arranged in this order from the organic EL layer side;
    the metal layer includes a first metal and a low work function metal, where a work function of said low work function metal is smaller than a work function of said first metal;
    said metal layer has a first surface on the organic EL layer side and a second surface on the conductive oxide layer side, and a concentration of said low work function metal at said first surface is greater than a concentration of said low work function metal at said second surface;
    said organic EL device is a polymer type organic EL device;
    said metal layer includes a first metal layer including said first metal and said low work function metal, and a second metal layer including a second metal, arranged in the order of the first metal layer and the second metal layer from the organic EL layer side;
    said second metal layer includes substantially none of said low work function metal, or said second metal layer includes said low work function metal in a concentration that is lower than the concentration of said low work function metal in said first metal layer; and
    the second metal layer includes substantially no organic material.

2. The organic EL device according to claim 1, wherein the concentration of said low work function metal at said second surface is about 30% by mass or less.

3. The organic EL device according to claim 1, wherein the concentration of said low work function metal at said first surface is about 5% by mass to about 50% by mass.

4. The organic EL device according to claim 1, wherein a thickness of said first metal layer is about 0.5 nm to about 20 nm.

5. The organic EL device according to claim 1, wherein said first metal includes at least one type of metal selected from the group consisting of Ni, Os, Pt, Pd, Al, Au and Rh.

6. The organic EL device according to claim 1, wherein said low work function metal includes at least one type of metal selected from the group consisting of Ca, Ba, Li and Cs.

7. The organic EL device according to claim 1, wherein said second metal is identical to said first metal.

8. The organic EL device according to claim 1, wherein said second metal is different from said first metal.

9. The organic EL device according to claim 1, wherein the concentration of said low work function metal at the surface of said second metal layer on the conductive oxide layer side is substantially zero.

10. The organic EL device according to claim 1, wherein said first metal layer has a third surface on the organic EL layer side and a fourth surface on the second metal layer side, and the concentration of said low work function metal at said first layer is high at said third surface, and decreases as said fourth surface is approached.

11. The organic EL device according to claim 1, wherein the concentration of said low work function metal at said third surface of said first metal layer is about 5% by mass to about 70% by mass.

12. The organic EL device according to claim 1, wherein the sum of the thickness of said first metal layer and the thickness of said second metal layer is about 35 nm or less.

13. The organic EL device according to claim 1, wherein a thickness of said first metal layer is about 0.5 nm to about 10 nm.

14. The organic EL device according to claim 1, wherein said second metal includes at least one type of metal selected from the group consisting of Ni, Os, Pt, Pd, Al, Au and Rh.

15. The organic EL device according to claim 1, wherein said organic EL device has a top emission structure.

16. The organic EL device according to claim 1, wherein said organic EL device is a polymer type organic EL device having a top emission structure.

17. The organic EL device according to claim 1, wherein said fluorescent layer includes a high-molecular light emission material.

18. The organic EL device according to claim 1, wherein said conductive oxide layer is a sputtered layer made by a sputtered gas containing oxygen.

19. A display apparatus comprising:
the organic EL device according to claim 1; and
a thin film transistor electrically connected to said organic EL device.

20. The organic EL device according to claim 1, wherein the first metal and the low work function metal forms an alloy layer in the metal layer.

21. The organic EL device according to claim 20, wherein the concentration of said low work function metal at a surface on the organic EL layer side of the alloy layer is greater than the concentration of the low work function metal at a surface on the conductive oxide layer side of the alloy layer.

22. The organic EL device according to claim 20, wherein the concentration of the low work function metal of the alloy layer decreases in a direction extending away from the surface on the organic EL layer side.

23. The organic EL device according to claim 1, wherein the first surface of the metal layer contacts the organic EL layer.

24. The organic EL device according to claim 1, wherein the second surface of the metal layer contacts the conductive oxide layer.

25. The organic EL device according to claim 1, wherein the organic EL layer includes a hole injection layer having at least one of polyethylenedioxythiophene and polystyrenesulfonate.

26. The organic EL device according to claim 1, wherein the low work function metal includes at least one of Ca and Ba.

27. The organic EL device according to claim 1, wherein the first metal layer is an alloy layer including the first metal and the low work function metal.

28. The organic EL device according to claim 1, wherein the second metal of the second metal layer is the same as the first metal.

29. The organic EL device according to claim 1, wherein the second metal layer includes substantially no low work function metal.

* * * * *